(12) United States Patent
Jeong

(10) Patent No.: US 11,551,744 B2
(45) Date of Patent: Jan. 10, 2023

(54) MERGED BUFFER AND MEMORY DEVICE INCLUDING THE MERGED BUFFER

(71) Applicant: SK hynix Inc., Icheon-si Gyeonggi-do (KR)

(72) Inventor: Chan Hui Jeong, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 32 days.

(21) Appl. No.: 17/158,767

(22) Filed: Jan. 26, 2021

(65) Prior Publication Data

US 2022/0044724 A1 Feb. 10, 2022

(30) Foreign Application Priority Data

Aug. 10, 2020 (KR) .................. 10-2020-0100167

(51) Int. Cl.
*G11C 11/4093* (2006.01)
*G11C 11/4099* (2006.01)
*G11C 5/06* (2006.01)
*G11C 11/4091* (2006.01)
*G11C 11/4094* (2006.01)

(52) U.S. Cl.
CPC ............ *G11C 11/4093* (2013.01); *G11C 5/06* (2013.01); *G11C 11/4091* (2013.01); *G11C 11/4094* (2013.01); *G11C 11/4099* (2013.01)

(58) Field of Classification Search
CPC .............................. G11C 11/4093; G11C 5/06
USPC .................................................... 365/189.05
See application file for complete search history.

(56) References Cited

U.S. PATENT DOCUMENTS

| 2012/0230103 | A1* | 9/2012 | Choe | H01L 29/7926 365/185.18 |
| 2013/0003453 | A1* | 1/2013 | Park | G11C 16/10 365/185.25 |
| 2016/0155512 | A1* | 6/2016 | Ogawa | G11C 7/1039 365/185.18 |
| 2019/0189217 | A1* | 6/2019 | Hong | G11C 29/021 |

FOREIGN PATENT DOCUMENTS

| KR | 100590140 B1 | 6/2006 |
| KR | 1020100117504 A | 11/2010 |
| KR | 101150432 B1 | 6/2012 |
| KR | 101847095 B1 | 4/2018 |

* cited by examiner

*Primary Examiner* — Anthan Tran
(74) *Attorney, Agent, or Firm* — William Park & Associates Ltd.

(57) ABSTRACT

A memory device according to the present technology includes a memory cell array configured to include planes having a plurality of memory cells, a page buffer connected to at least one memory cell among the memory cells through a bit line and configured to perform a sensing operation of reading data stored in the at least one memory cell connected to the bit line, a common reference voltage generator configured to generate a common reference voltage, a plurality of merged buffers configured to generate a reference signal using the common reference voltage, and control logic configured to control an operation of the common reference voltage generator and the merged buffers so that page buffer control signals generated based on the reference signal are supplied to the page buffer.

14 Claims, 21 Drawing Sheets

MERGED BUFFER AND MEMORY DEVICE INCLUDING THE MERGED BUFFER

CROSS-REFERENCE TO RELATED APPLICATION

The present application claims priority under 35 U.S.C. § 119(a) to Korean patent application number 10-2020-0100167 filed on Aug. 10, 2020, in the Korean Intellectual Property Office, the entire disclosure of which is incorporated by reference herein.

BACKGROUND

1. Technical Field

The present disclosure relates to a merged buffer, and more particularly, to a merged buffer and a memory device including the merged buffer.

2. Related Art

A storage device is a device that stores data under control of a host device such as a computer or a smartphone. The storage device may include a memory device in which data is stored and a memory controller controlling the memory device. The memory device is divided into a volatile memory device and a non-volatile memory device.

The volatile memory device is a device that stores data only when power is supplied and loses the stored data when the power supply is cut off. The volatile memory device includes a static random access memory (SRAM), a dynamic random access memory (DRAM), and the like.

The non-volatile memory device is a device that does not lose data even though power is cut off. The non-volatile memory device includes a read only memory (ROM), a programmable ROM (PROM), an electrically programmable ROM (EPROM), an electrically erasable and programmable ROM (EEPROM), a flash memory, and the like.

SUMMARY

A memory device according to an embodiment may include a memory cell array configured to include planes having a plurality of memory cells, a page buffer connected to at least one memory cell among the memory cells through a bit line and configured to perform a sensing operation of reading data stored in the at least one memory cell connected to the bit line, a common reference voltage generator configured to generate a common reference voltage, a plurality of merged buffers configured to generate a reference signal using the common reference voltage, and control logic configured to control an operation of the common reference voltage generator and the merged buffers so that page buffer control signals generated based on the reference signal are supplied to the page buffer.

A merged buffer according to an embodiment may include an input circuit configured to receive a common reference voltage, at least one constant current generator configured to generate a constant current having a constant magnitude, at least one current mirror component configured to generate a current and a mirror current having a magnitude corresponding to each other; at least one current induction component configured to output a current in response to the mirror current, an output circuit configured to generate a reference signal based on the current output from the current induction component and the mirror current, and a feedback component configured to generate a current in response to a voltage fed back from the output circuit.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

An embodiment of the present disclosure provides a merged buffer that quickly stabilizes reference signals and supports overdrive and underdrive functions, and a memory device including the merged buffer.

The present technology may provide a merged buffer that quickly stabilizes reference signals and supports overdrive and underdrive functions, and a memory device including the merged buffer.

Figure 1:
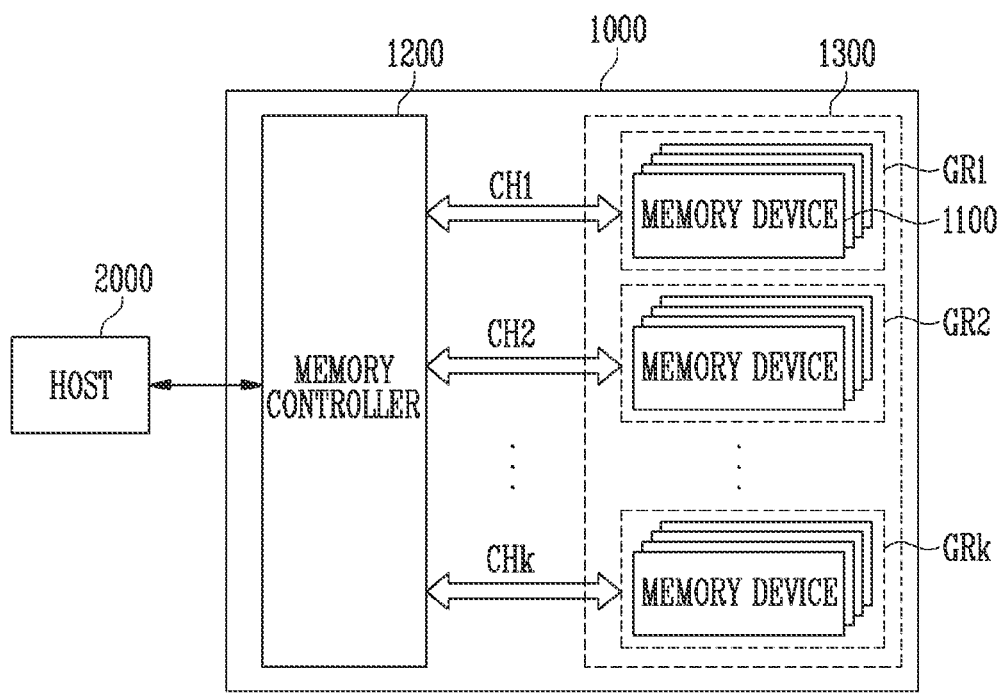
FIG. 1 is a diagram illustrating a memory system according to an embodiment.

FIG. 1 is a diagram illustrating a memory system according to an embodiment.

Referring to FIG. 1, the memory system 1000 may include a memory device 1100 in which data is stored, and/or a memory controller 1200 that controls the memory device 1100 according to a request of a host 2000.

The host 2000 may communicate with the memory system 1000 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The memory device 1100 may be implemented as a volatile memory device in which data is lost when power supply is cut off or a non-volatile memory device in which data is maintained even though power supply is cut off. The memory device 1100 may perform a program operation, a read operation, or an erase operation under control of the memory controller 1200. For example, during the program operation, the memory device 1100 may receive a command, an address, and data from the memory controller 1200 and perform the program operation. During the read operation, the memory device 1100 may receive a command and an address from the memory controller 1200, and output data stored in a position (for example, a physical address) corresponding to the received address to the memory controller 1200. The memory device 1100 may be referred to as a chip or a die as an individual integrated chip (IC) of which an element process is ended.

The memory system 1000 may include a plurality of memory devices 1100, and the plurality of memory devices may be grouped into a plurality of memory device groups 1300 according to a channel connected to the memory controller 1200. For example, among the memory devices, memory devices connected to the memory controller 1200 through a first channel CH1 may be referred to as a first group GR1. Among the memory devices, memory devices connected to the memory controller 1200 through a second channel CH2 may be referred to as a second group GR2. FIG. 1 illustrates that one group includes a plurality of memory devices. However, one group may include a single memory device 1100.

The memory controller 1200 may control an overall operation of the memory system 1000 and control data exchange between the host 2000 and the memory device 1100. For example, when a command is received from the host 2000, the memory controller 1200 may control the memory device groups 1300 connected to respective channels CH1 to CHk according to the received command. The memory controller 1200 may control the memory device groups 1300 connected to the respective channels according to the request of the host 2000 to program, read, or erase data.

Figure 2:
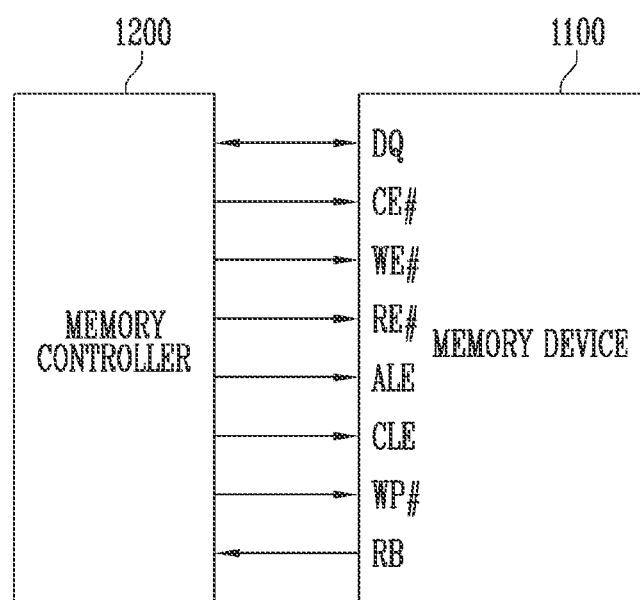
FIG. 2 is a diagram illustrating signals exchanged between a memory controller and a memory device according to FIG. 1.

FIG. 2 is a diagram illustrating signals exchanged between the memory controller and the memory device according to FIG. 1.

Referring to FIG. 2, the memory controller 1200 and the memory device 1100 may exchange a command, data, and/or an address with each other through an input/output pad DQ. For example, the input/output pad DQ may be configured of eight lines to transmit and receive data of 8 bits, and each line may transmit and receive data of 1 bit.

The memory device 1100 may receive a chip enable signal through a CE # pad, receive a write enable signal through a WE # pad, receive a read enable signal through an RE # pad, receive an address latch enable signal through an ALE pad, receive a command latch enable signal through a CLE pad, and receive a write protection signal through a WP # pad.

The address latch enable signal may be a signal instructed by the memory controller 1200 to the memory device 1100 so that the memory device 1100 loads the address provided to the memory device 1100 through the input/output pad DQ in an address register. The chip enable signal may be a signal instructed by the memory controller 1200 to the memory device 1100 to enable or disable one or more memory devices. The command latch enable signal may be a signal instructed by the memory controller 1200 to the memory device 1100 so that the memory device 1100 loads the command provided to the memory device 1100 through the input/output pad DQ in a command register. The read enable signal may be a signal instructed by the memory controller 1200 to the memory device 1100 so that the memory device 1100 transmits the data to the memory controller 1200. The write enable signal may be a signal informing that the command, the address, and the data are transferred.

The memory device 1100 may output a ready-busy signal to the memory controller 1200 through an RB pad RB. The ready-busy signal may indicate whether a memory array of the memory device 1100 is in a busy state or an idle state.

FIG. 2 illustrates a connection relationship between one memory device 1100 and the memory controller 1200. However, the input/output pad DQ, the CE # pad, the WE # pad, the RE # pad, the ALE pad, the CLE pad, and the WP # pad may form the channels CH1 to CHk, and the memory controller 1200 and one of the memory device groups 1300 may be connected through the formed channels CH1 to CHk.

Therefore, when the memory controller 1200 transmits the command, the data, and/or the address through the input/output pad DQ included in one channel, all of the memory devices 1100 belonging to a group connected to the corresponding channel or a memory device 1100 selected by the memory controller 1200 in a group connected to the corresponding channel may receive the command, the data, and/or the address. For example, the memory controller 1200 may transmit the status read command to the memory devices 1100 through the input/output pad DQ corresponding to the first channel CH1, and, at least one of the memory devices in the first group GR1 connected to the first channel CH1 may transmit status information to the input/output pad DQ in response to the status read command.

Figure 3:
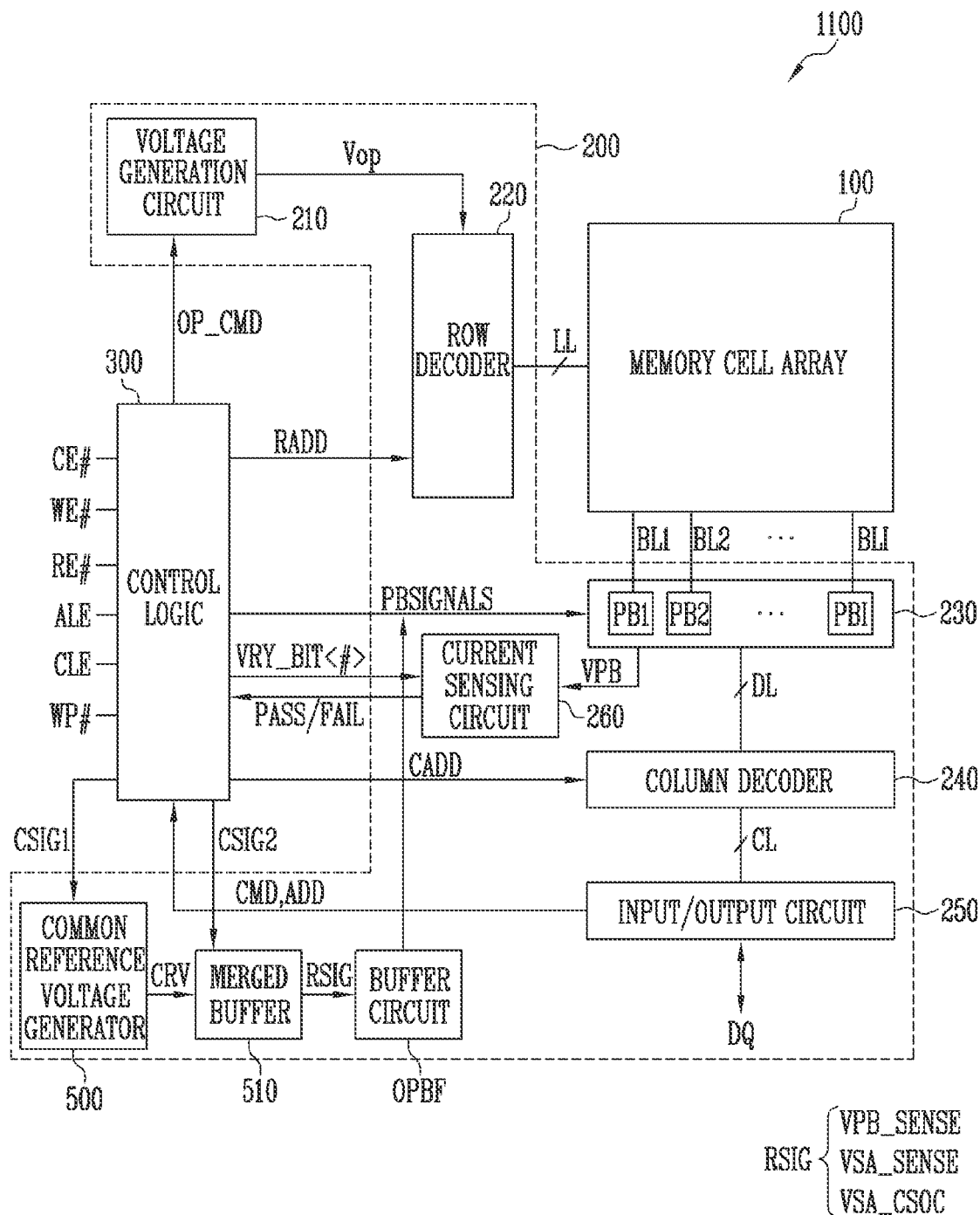
FIG. 3 is a diagram for describing the memory device of FIG. 1.

FIG. 3 is a diagram for describing the memory device of FIG. 1.

The memory device 1100 may be implemented as a volatile memory device or a non-volatile memory device. For example, the memory device 1100 may be one of a volatile memory devices such as a dynamic random access memory (DRAM) and a static RAM (SRAM), and a non-volatile memory device such as a read only memory (ROM), a mask ROM (MROM), a programmable ROM (PROM), an erasable ROM (EPROM), an electrically erasable ROM (EEPROM), a ferromagnetic ROM (FRAM), a phase change RAM (PRAM), a magnetic RAM (MRAM), a resistive RAM (RRAM), and a flash memory. FIG. 3 illustrates a non-volatile memory device as an example.

The memory device 1100 may include a memory cell array 100 in which data is stored. The memory device 1100 may include a peripheral circuit 200 configured to perform a program operation for storing data in the memory cell array 100, a read operation for outputting the stored data, and an erase operation for erasing the stored data. The memory device 1100 may include control logic 300 that controls the peripheral circuit 200 under control of the memory controller 1200. The control logic 300 may be implemented as hardware, software, or a combination of hardware and software. For example, the control logic 300 may be a control logic circuit operating in accordance with an algorithm and/or a processor executing control logic code.

The memory cell array 100 includes a plurality of memory cells in which data is stored. For example, the memory cell array 100 may include at least one plane, the plane may include one or more memory blocks. In an embodiment, the plane may be a unit of a memory area accessed when the program, read, or erase operation is performed. Each of the memory blocks may include a plurality of memory cells. A structure including a plurality of planes may be referred to as a multi-plane structure. User data and information necessary for an operation of the memory device 1100 may be stored in the memory blocks. The memory blocks may be implemented in a two-dimensional or three-dimensional structure. The memory blocks having the two-dimensional structure may include memory cells arranged parallel to a substrate, and the memory blocks having the three-dimensional structure may include memory cells stacked vertically on the substrate.

The peripheral circuit 200 may be configured to perform the program, read, and erase operations according to the control of the control logic 300. For example, the peripheral circuit 200 may include a voltage generation circuit 210, a row decoder 220, a page buffer group 230, a column decoder 240, an input/output circuit 250, and a current sensing circuit 260.

The voltage generation circuit 210 may generate various operation voltages Vop used for the program, read, and erase operations, in response to an operation signal OP_CMD output from the control logic 300. For example, the voltage generation circuit 210 may generate various voltages, such as a program voltage, a verify voltage, a pass voltage, a read voltage, and an erase voltage, under the control of the control logic 300.

The row decoder 220 may supply the operation voltages Vop to local lines LL connected to a selected memory block among the memory blocks of the memory cell array 100, in response to a row address RADD output from the control logic 300. The local lines LL may include local word lines, local drain select lines, and/or local source select lines. In addition, the local lines LL may include various lines connected to the memory block, such as a source line.

The page buffer group 230 may be connected to bit lines BL1 to BLI connected to the memory blocks of the memory cell array 100. The page buffer group 230 may include a plurality of page buffers PB1 to PBI connected to the bit lines BL1 to BLI. The page buffers PB1 to PBI may operate in response to page buffer control signals PBSIGALS output from the control logic 300. For example, the page buffers PB1 to PBI may temporarily store data received through the bit lines BL1 to BLI, or may sense a voltage or a current of the bit lines BL1 to BLI during the read operation or a verify operation.

The column decoder 240 may transfer data between the input/output circuit 250 and the page buffer group 230 in response to a column address CADD output from the control logic 300. For example, the column decoder 240 may exchange data with the page buffers PB1 to PBI through data lines DL, or exchange data with the input/output circuit 250 through column lines CL.

The input/output circuit 250 may receive a command CMD, an address ADD, and data from the memory controller 1200 through the input/output pad DQ, and output data read from the memory cell array 100 to the memory controller 1200 through the input/output pad DQ. For example, the input/output circuit 250 may transfer the command CMD and the address ADD received from the memory controller 1200 to the control logic 300 or exchange data DATA with the column decoder 240.

During the read operation or the verify operation, the current sensing circuit 260 may generate a reference current in response to a permission bit VRY_BIT<#>, compare a sensing voltage VPB received from the page buffer group 230 with a reference voltage generated by the reference current, and output a pass signal PASS or a fail signal FAIL.

The control logic 300 may receive the command CMD and the address ADD in response to the signals received through the CE #, WE #, RE #, ALE, CLE, and WP # pads. The control logic 300 may generate control signals for controlling the peripheral circuit 200 in response to receiving the command CMD and the address ADD, and output the generated control signals to the peripheral circuit 200. For example, the control signals may include at least one of the operation signal OP_CMD, the row address RADD, the column address CADD, the page buffer control signals PBSIGNALS, and the permission bit VRY_BIT<#>. The control logic 300 may output the operation signal OP_CMD to the voltage generation circuit 210, output the row address RADD to the row decoder 220, output the column address CADD to the column decoder 240, output the page buffer control signals PBSIGNALS to the page buffer group 230, and output the permission bit VRY_BIT<#> to the current sensing circuit 260. In addition, the control logic 300 may determine whether the verify operation is passed or failed in response to the pass signal PASS or the fail signal FAIL.

Meanwhile, at least some of the page buffer control signals PBSIGNALS may not be directly output by the control logic 300, and separate circuits that output the page buffer control signals PBSIGNALS according to control of the control logic 300 may be present.

For example, the memory device 1100 may further include a common reference voltage generator 500 that generates a common reference voltage CRV, a merged buffer 510 that generates a reference signal RSIG for at least one of the page buffer control signals PBSIGNALS using the common reference voltage CRV, and a buffer circuit OPBF that receives the reference signal RSIG and outputs at least one of the page buffer control signals PBSIGNALS.

At least one of the page buffer control signals PBSIGNALS output from the buffer circuit OPBF may include at least one of a first sensing signal PB_SENSE, a second sensing signal SA_CSOC, and a third sensing signal SA_SENSE for controlling a sensing operation of the page buffers PB1 to PBI.

The reference signal RSIG may include a first reference sensing signal VPB_SENSE for generating the first sensing signal PB_SENSE, a second reference sensing signal VSA_CSOC for generating the second sensing signal SA_CSOC, and a third reference sensing signal VSA_SENSE for generating the third sensing signal SA_SENSE.

The merged buffer 510 may be included in the memory device 1100 by the number corresponding to planes of the memory cell array 100. For example, when the memory cell array 100 includes first to fourth planes P1 to P4 (refer to FIG. 8), the memory device 1100 may include the merged buffer 510 that generates a reference signal for the first plane P1, the merged buffer 510 that generates a reference signal for the second plane P2, the merged buffer 510 that generates a reference signal for the third plane P3, and the merged buffer 510 that generates a reference signal for the fourth plane P4.

The control logic 300 may control an operation of the common reference voltage generator 500 and the merged buffer 510 so that the page buffer control signals PBSIG-NALS generated based on the reference signal RSIG are supplied to the page buffers PB1 to PBI. The control logic 300 may supply a first control signal CSIG1 for controlling the operation of the common reference voltage generator 500 to the common reference voltage generator 500 and may supply a second control signal CSIG2 for controlling the operation of the merged buffer 510 to the merged buffer 510. The first control signal CSIG1 may include a signal for enabling or disabling the operation of the common reference voltage generator 500 and a signal for determining a resistance value of a variable resistor Rx (refer to FIG. 14) included in the common reference voltage generator 500. The second control signal CSIG2 may include a signal for enabling or disabling the operation of the merged buffer 510 and a drive control signal for determining resistance values of variable resistors VR1, VR2, and VR3 included in the merged buffer 510. The merged buffer 510 may output the reference signal RSIG having a voltage level corresponding to one of a reference level corresponding to a preset voltage level, an overdrive level higher than the reference level, and an underdrive level lower than the reference level, based on the drive control signal.

The common reference voltage generator 500, the merged buffer 510, and the buffer circuit OPBF are described in below with reference to FIGS. 10 to 20.

Figure 4:
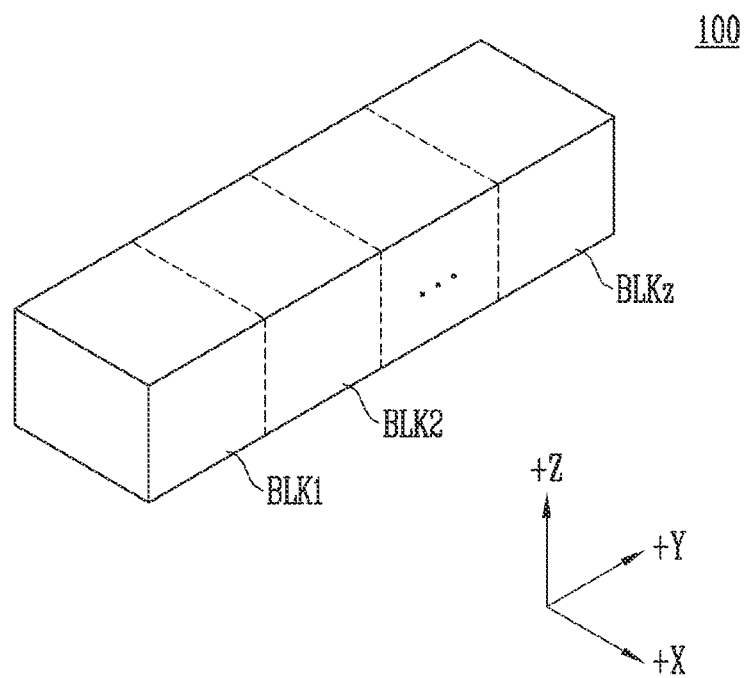
FIG. 4 is a diagram illustrating an embodiment of a memory cell array of FIG. 3.

FIG. 4 is a diagram illustrating an embodiment of the memory cell array of FIG. 3.

Referring to FIG. 4, the memory cell array 100 includes a plurality of memory blocks BLK1 to BLKz. Each memory block may have a three-dimensional structure. Each memory block may include a plurality of memory cells stacked on a substrate. The plurality of memory cells may be arranged along a +X direction, a +Y direction, and a +Z direction.

Figure 5:
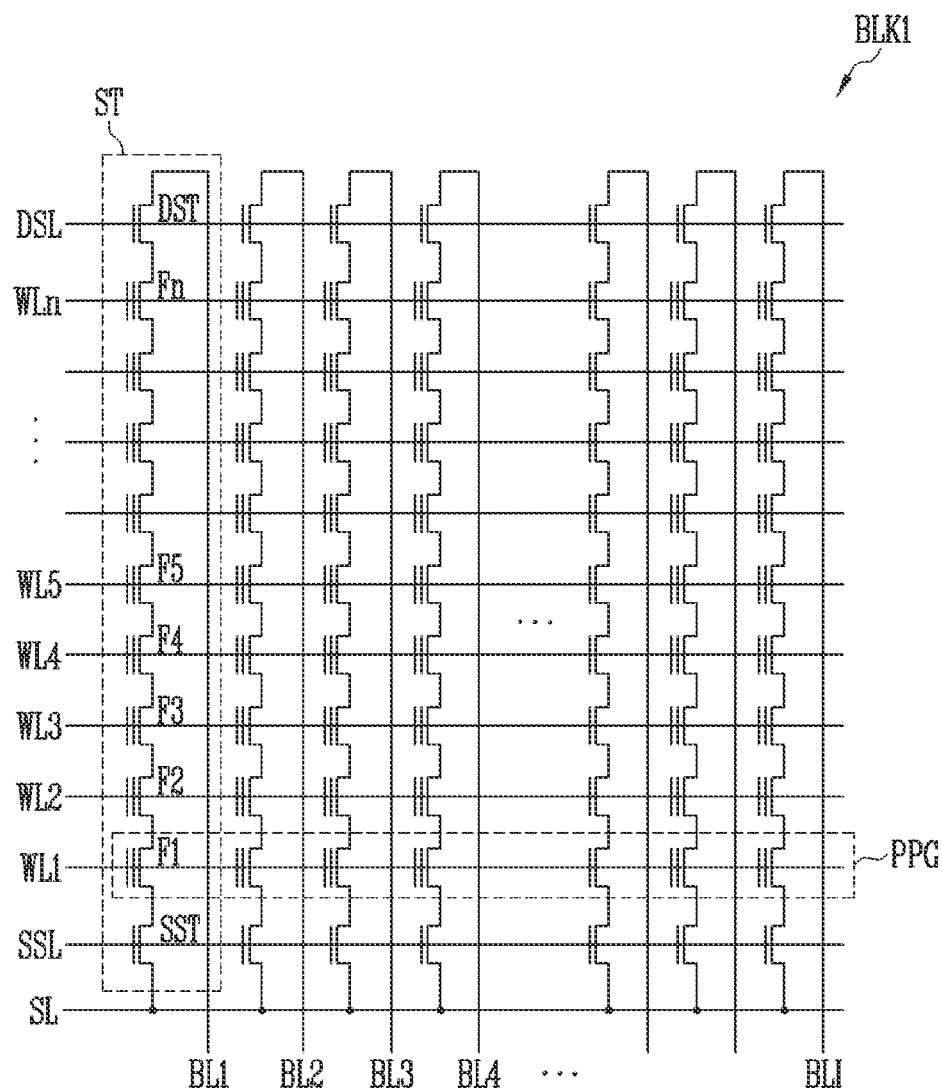
FIG. 5 is a diagram illustrating a memory block of FIG. 4.

FIG. 5 is a diagram illustrating the memory block of FIG. 4.

Referring to FIG. 5, the first memory block BLK1 among the plurality of memory blocks BLK1 to BLKz shown in FIG. 4 is exemplarily shown. The remaining memory blocks BLK2 to BLKz may have the same shape as the first memory block BLK1.

The first memory block BLK1 may include a plurality of cell strings ST connected between bit lines BL1 to BLI and a source line SL. For example, the cell strings ST may be connected to the bit lines BL1 to BLI, respectively, and may be commonly connected to the source line SL. Since the cell strings ST are configured similarly to each other, a string ST connected to the first bit line BL1 is described as an example as follows.

The cell string ST may include a source select transistor SST, first to n-th memory cells F1 to Fn (n is a positive integer), and a drain select transistor DST connected in series between the source line SL and the first bit line BL1. The number of source and drain select transistors SST and DST is not limited to the number shown in FIG. 5. The source select transistor SST may be connected between the source line SL and the first memory cell F1. The first to n-th memory cells F1 to Fn may be connected in series between the source select transistor SST and the drain select transistor DST. The drain select transistor DST may be connected between the n-th memory cell Fn and the first bit line BL1. Although not shown in the drawing, dummy cells may be further connected between the memory cells F1 to Fn or between the source select transistor SST and the drain select transistor DST.

Gates of the source select transistors SST included in the different cell strings ST may be connected to a source select line SSL, gates of the first to n-th memory cells F1 to Fn may be connected to first to n-th word lines WL1 to WLn, respectively, and gates of the drain select transistors DST may be connected to drain select lines DSL. Here, a group of memory cells connected to the word lines WL1 to WLn, respectively, is referred to as a page PG. For example, a group of the first memory cells F1 connected to the first word line WL1 among the memory cells F1 to Fn included in the different cell strings ST may be one physical page PPG. The program and read operations may be performed in a unit of the physical page PPG.

Figure 6:
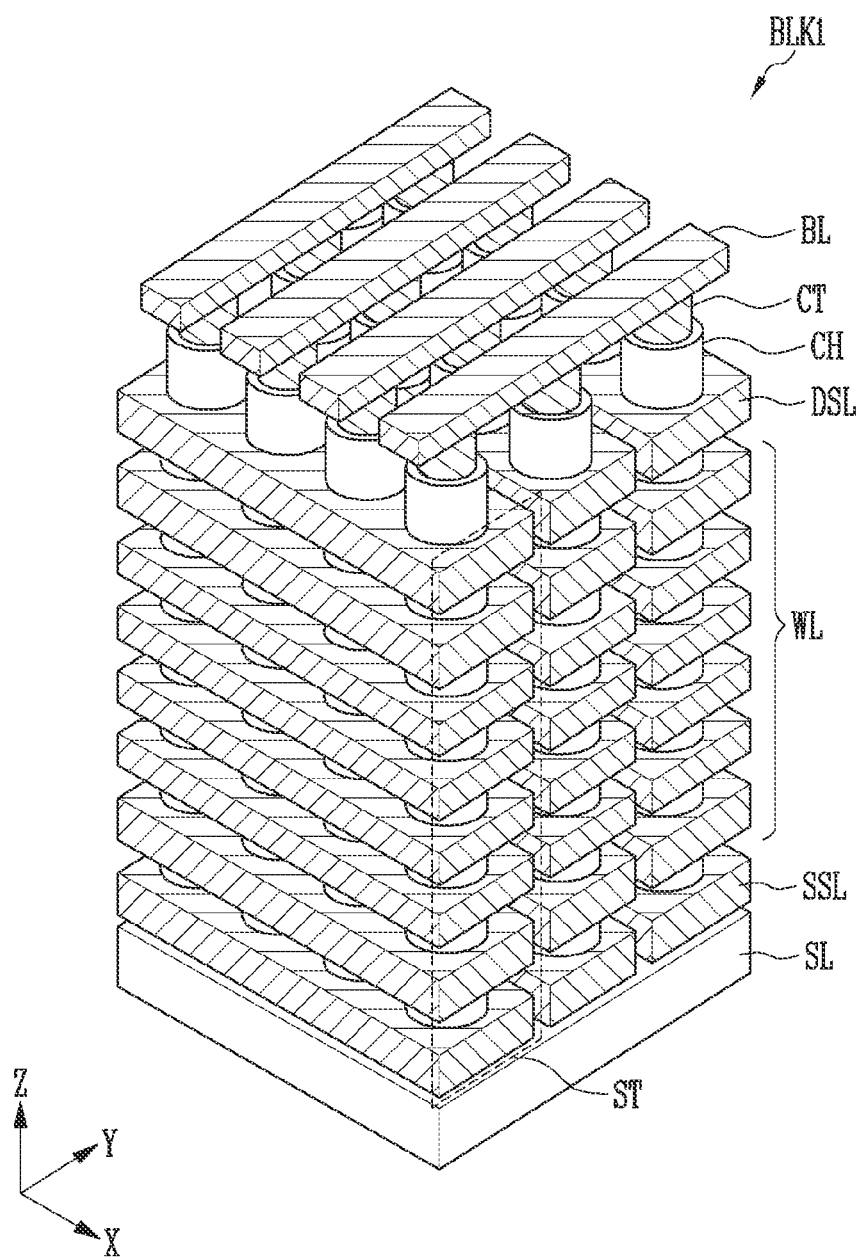
FIG. 6 is a diagram illustrating an embodiment in which the memory block of FIG. 4 is configured in three dimensions.

FIG. 6 is a diagram illustrating an embodiment in which the memory block of FIG. 4 is configured in three dimensions.

Referring to FIG. 6, the first memory block BLK1 among the plurality of memory blocks BLK1 to BLKz shown in FIG. 4 is shown, for example. The remaining memory blocks BLK2 to BLKz may have the same shape as the first memory block BLK1.

The memory block BLK1 implemented in a three-dimensional structure may be formed in a vertical (Z direction) I shape on a substrate, and may include the plurality of cell strings ST arranged between the bit lines BL and the source line SL. Alternatively, a well may be formed instead of the source line SL. Such a structure is also referred to as bit cost scalable (BiCS). For example, when the source line SL is horizontally formed on the substrate, the cell strings ST having the BiCS structure may be formed in the vertical direction (Z direction) on the source line SL.

For example, the cell strings ST may be arranged in each of a first direction (X direction) and a second direction (Y direction). The cell strings ST may include the source select lines SSL, the word lines WL, and the drain select lines DSL that are stacked and spaced apart from each other. The number of the source select lines SSL, word lines WL, and drain select lines DSL is not limited to the number shown in the drawing, and may be different according to the memory device 1100. The cell strings ST may include a vertical channel film CH vertically passing through the source select lines SSL, the word lines WL, and the drain select lines DSL, and the bit lines BL which are in contact with an upper portion of the vertical channel film CH protruded to an upper portion of the drain select lines DSL and extend in the second direction (Y direction). The memory cells may be formed between the word lines WL and the vertical channel films CH. A contact plug CT may be further formed between the bit lines BL and the vertical channel films CH.

Figure 7:
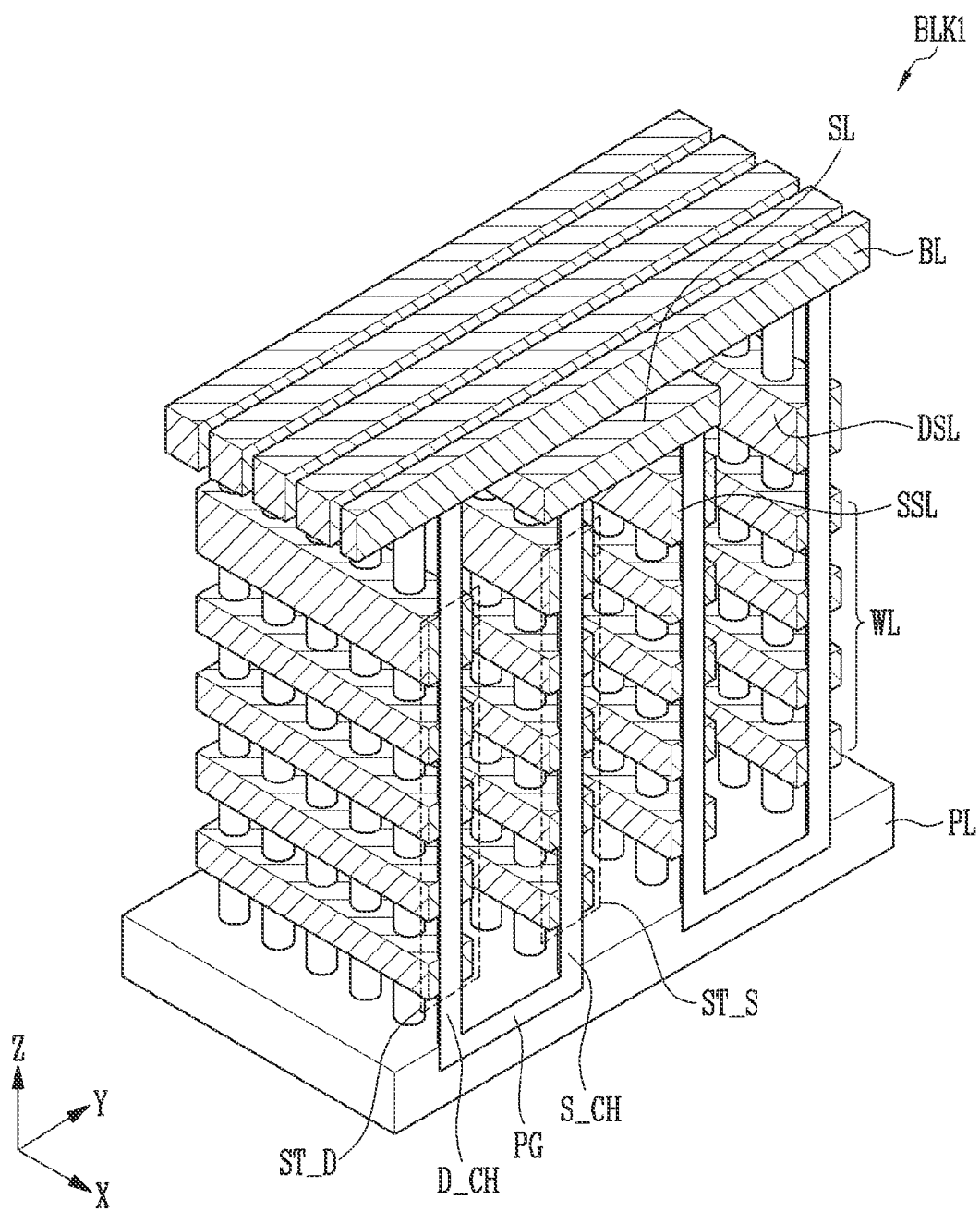
FIG. 7 is a diagram illustrating another embodiment in which the memory block of FIG. 4 is configured in three dimensions.

FIG. 7 is a diagram illustrating another embodiment in which the memory block of FIG. 4 is configured in three dimensions.

Referring to FIG. 7, the first memory block BLK1 among the plurality of memory blocks BLK1 to BLKz shown in FIG. 4 is shown, for example. The remaining memory blocks BLK2 to BLKz may have the same shape as the first memory block BLK1.

The first memory block BLK1 implemented in a three-dimensional structure may be formed in a U shape of a vertical direction (Z direction) on a substrate, and may include a pair of source strings ST_S and drain strings ST_D connected between the bit lines BL and the source lines SL. The source strings ST_S and the drain strings ST_D may be connected to each other through a pipe gate PG to form a U-shaped structure. The pipe gate PG may be formed in a pipeline PL. For example, the source strings ST_S may be vertically formed between the source lines SL and the pipeline PL, and the drain strings ST_D may be vertically formed between the bit lines BL and the pipeline PL. Such a structure is also referred to as pipe-shaped bit cost scalable (P-BiCS).

For example, the drain strings ST_D and the source strings ST_S may be arranged in the first direction (X direction) and the second direction (Y direction), respectively, and the drain strings ST_D and the source strings ST_S may be alternately arranged along the second direction (Y direction). The drain strings ST_D may include the word lines WL and the drain select line DSL that are stacked and spaced apart from each other, and drain vertical channel films D_CH vertically passing through the word lines WL and the drain select lines DSL. The source strings ST_S may include the word lines WL and the source select line SSL that are stacked and spaced apart from each other, and source vertical channel films S_CH vertically passing through the word lines WL and the source select lines SSL. The drain vertical channel films D_CH and the source vertical channel films S_CH may be connected to each other by the pipe gate PG in the pipeline PL. The bit lines BL may be in contact with an upper portion of the drain vertical channel films D_CH protruded to an upper portion of the drain select line DSL and may extend in the second direction (Y direction).

Figure 8:
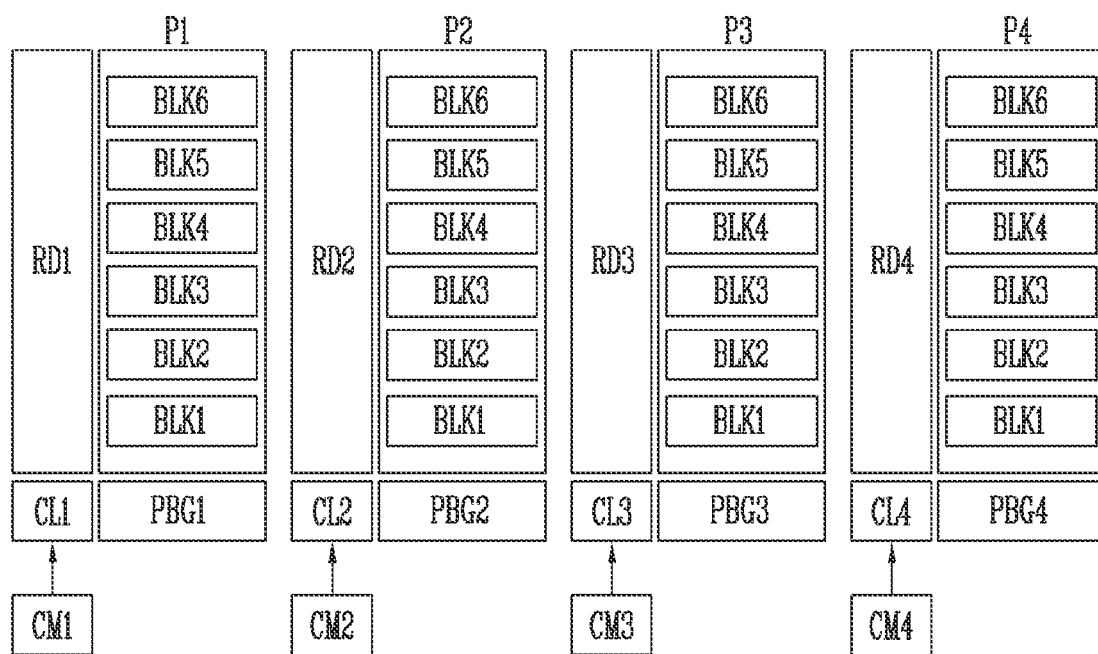
FIG. 8 is a diagram illustrating a multi-plane structure in the memory device according to FIG. 1.

FIG. 8 is a diagram illustrating a multi-plane structure in the memory device according to FIG. 1.

Referring to FIG. 8, the memory cell array 100 of the memory device 1100 may include the plurality of planes P1 to P4. For example, the first to fourth planes P1 to P4 may be included in the memory cell array 100 in one memory device 1100.

The respective first to fourth planes P1 to P4 may be connected to row decoders RD1 to RD4 and page buffer groups PBG1 to PBG4, and may independently operate. For example, the first plane P1 may be connected to the first row decoder RD1 and the first page buffer group PBG1 to operate, the second plane P2 may be connected to the second row decoder RD2 and the second page buffer group PBG2 to operate, and the third plane P3 may be connected to the third row decoder RD3 and the third page buffer group PBG3 to operate.

For example, during the read operation, the respective first to fourth row decoders RD1 to RD4 may apply a read voltage to a memory block selected from the respective first to fourth planes P1 to P4 in response to a received row address. The first to fourth page buffer groups PBG1 to PBG4 may temporarily store read data by sensing a voltage or a current of bit lines connected to the first to fourth planes P1 to P4. When all sensing operations of the first to fourth planes P1 to P4 are completed, the read data temporarily stored in the first to fourth page buffer groups PBG1 to PBG4 may be sequentially output through the input/output circuit 250. For example, after the read data of the first page buffer group PBG1 is first output, the read data of the second to fourth page buffer groups PBG2 to PBG4 may be sequentially output.

As shown in FIG. 8, the memory device 1100 including the plurality of planes P1 to P4 may perform the read, program, or erase operation simultaneously (or in parallel) on blocks or pages positioned in different planes. For example, the memory controller 1200 may transmit a command instructing a plane interleave operation to the control logic 300. For example, the memory controller 1200 may transmit a command instructing a plane interleave read operation to the control logic 300 to simultaneously read the blocks or the pages positioned in different planes. The words "simultaneous" and "simultaneously" as used herein with respect to occurrences mean that the occurrences take place on overlapping intervals of time. For example, if a first occurrence takes place over a first interval of time and a second occurrence takes place simultaneously over a second interval of time, then the first and second intervals at least partially overlap each other such that there exists a time at which the first and second occurrences are both taking place.

Meanwhile, in order to perform the plane interleave operation, the control logic 300 may include independent control logics CL1 to CL4 corresponding to the respective planes P1 to P4. For example, the first control logic CL1 may control the operation of the first plane P1, the second control logic CL2 may control the operation of the second plane P2, the third control logic CL3 may control the operation of the third plane P3, and the fourth control logic CL4 may control the operation of the fourth plane P4. Therefore, the first to fourth row decoders RD1 to RD4 and the first to fourth page buffers PBG1 to PBG4 may be independently controlled by the first to fourth control logics CL1 to CL4. In addition, at least some of the control logics CL1 to CL4 may be integrated so that one control logic controls two or more planes.

Figure 9:
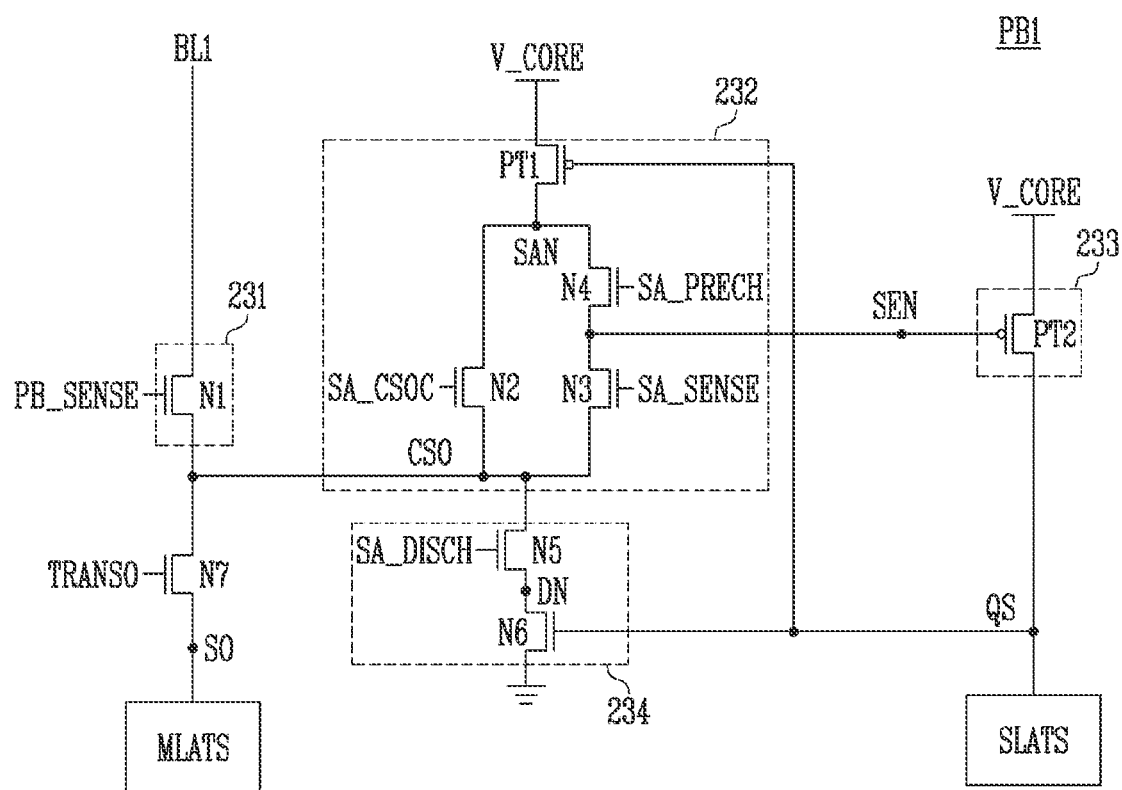
FIG. 9 is a diagram illustrating an embodiment of a page buffer of FIG. 3.

FIG. 9 is a diagram illustrating an embodiment of the page buffer of FIG. 3.

The first page buffer PB1 among the plurality of page buffers PB1 to PBI shown in FIG. 3 is, for example, described with reference to FIG. 9, but the remaining page buffers may also be configured identically or similarly to the first page buffer PB1.

The first page buffer PB1 may operate in response to a signal output from the control logic 300. Signals PB_SENSE, SA_PRECH, SA_SENSE, SA_CSOC, and SA_DISCH described below may be included in the page buffer control signals PBSIGNALS output from the control logic 140.

Referring to FIG. 9, the first page buffer PB1 may include a bit line connection component 231 electrically connecting the first bit line BL1 and a common sensing node CSO in response to the first sensing signal PB_SENSE, a precharge-sensing component 232 connected between the common sensing node CSO and a sensing node SEN, and performing a precharge operation of charging a charge supplied from supply power V_CORE to the first bit line BL1 and/or a sensing operation of sensing a current of the first bit line BL1, a sensing data output circuit 233 that outputs data corresponding to a potential level of the sensing node SEN to a latch node QS, and a sensing latch SLATS that latches (or stores) the data output to the latch node QS. Here, a voltage of the common sensing node CSO may be determined based on a threshold voltage of the memory cell connected to the first bit line BL1, and a voltage of the sensing node SEN electrically connected to the common sensing node CSO through the precharge-sensing component 232 may also be determined based on the threshold voltage of the memory cell connected to the first bit line BL1.

For example, the bit line connection component 231 may include a first NMOS transistor N1 connected between the first bit line BL1 and the common sensing node CSO, and having a gate electrode receiving the first sensing signal PB_SENSE. Therefore, the first NMOS transistor N1 may be turned on or turned off in response to the first sensing signal PB_SENSE.

The precharge-sensing component 232 may precharge the first bit line BL1 in response to the precharge signal SA_PRECH. In addition, the precharge-sensing component 232 may electrically connect the common sensing node CSO and a sensing amplifier node SAN, in response to the second sensing signal SA_CSOC, or may electrically connect the common sensing node CSO and the sensing node SEN in response to the third sensing signal SA_SENSE, to perform the sensing operation.

For example, the precharge-sensing component 232 may include a second NMOS transistor N2 connected between the common sensing node CSO and the sensing amplifier node SAN and having a gate electrode receiving the second sensing signal SA_CSOC, a third NMOS transistor N3 connected between the common sensing node CSO and the sensing node SEN and having a gate electrode receiving the third sensing signal SA_SENSE, a fourth NMOS transistor N4 connected between the sensing amplifier node SAN and the sensing node SEN and having a gate electrode receiving the precharge signal SA_PRECH, and a first PMOS transistor PT1 connected between the supply power V_CORE and the sensing amplifier node SAN and having a gate electrode connected to the latch node QS.

The second NMOS transistor N2 may electrically connect the sensing amplifier node SAN and the common sensing node CSO to each other in response to the second sensing signal SA_CSOC. The third NMOS transistor N3 may electrically connect the common sensing node CSO and the sensing node SEN to each other in response to the third sensing signal SA_SENSE. The fourth NMOS transistor N4 may electrically connect the sensing amplifier node SAN and the sensing node SEN to each other in response to the precharge signal SA_PRECH. The first PMOS transistor PT1 may transfer the charge supplied from the supply power V_CORE to the sensing amplifier node SAN based on a voltage level of the latch node QS.

The sensing data output circuit 233 may include a second PMOS transistor PT2 including a gate electrode connected to the sensing node SEN and connected between the supply power V_CORE and the latch node QS. The second PMOS transistor PT2 may electrically connect the supply power V_CORE and the latch node QS based on a voltage level applied to the sensing node SEN.

The first page buffer PB1 may further include a discharge component 234 connected between the common sensing node CSO and a ground to discharge the charge charged in the first bit line BL1 to the ground. The discharge component 234 may include a fifth NMOS transistor N5 including a gate electrode to which the discharge signal SA_DISCH is supplied and electrically connected between the common sensing node CSO and a discharge node DN, and a sixth NMOS transistor N6 connected between the discharge node DN and the ground and having a gate electrode connected to the latch node QS. The discharge component 234 may discharge the charge charged in the first bit line BL1 by electrically connecting the common sensing node CSO to the ground in response to the discharge signal SA_DISCH.

In addition, the first page buffer PB1 may further include a seventh NMOS transistor N7 electrically connecting the common sensing node CSO and a main latch sensing node SO in response to a transfer signal TRANSO and a main latch MLATS that latches a voltage level of the main latch sensing node SO.

For example, the first sensing signal PB_SENSE, the second sensing signal SA_CSOC, and the third sensing signal SA_SENSE may have a constant voltage level interval from each other.

Figure 10:
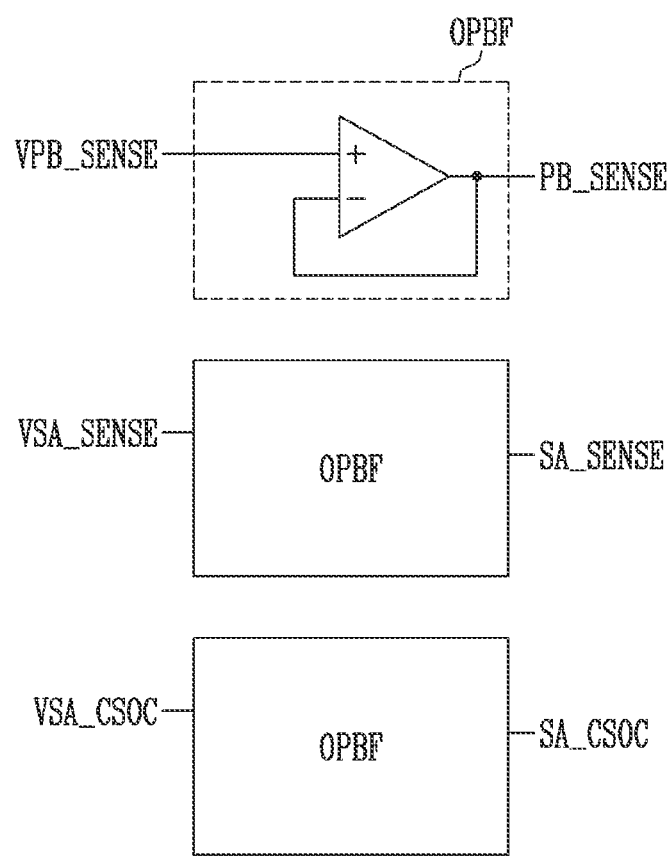
FIG. 10 is an example of a diagram illustrating reference signals for first to third sensing signals according to FIG. 9.
Figure 11:
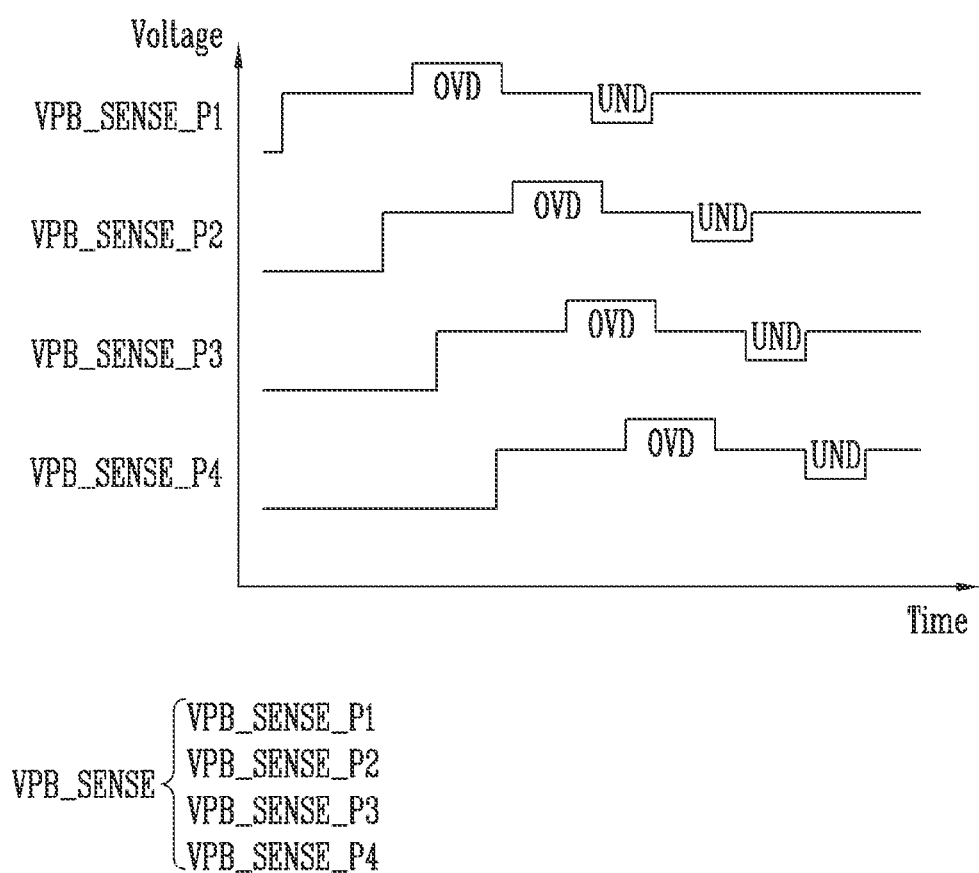
FIG. 11 is an example of a graph illustrating a point in which a first reference sensing signal is independently generated for each plane among the reference signals according to FIG. 10.

FIG. 10 is an example of a diagram illustrating reference signals for the first to third sensing signals according to FIG. 9. FIG. 11 is an example of a graph illustrating that a first reference sensing signal is independently generated for each plane among the reference signals according to FIG. 10.

Referring to FIG. 10, the first sensing signal PB_SENSE may be generated from the first reference sensing signal VPB_SENSE, the second sensing signal SA_CSOC may also be generated from the second reference sensing signal VSA_CSOC, and the third sensing signal SA_SENSE may also be generated from the third reference sensing signal VSA_SENSE.

For example, the first sensing signal PB_SENSE may be a signal output from the buffer circuit OPBF after the first reference sensing signal VPB_SENSE is input to the buffer circuit OPBF. Similarly, the second sensing signal SA_CSOC may be a signal output from the buffer circuit OPBF after the second reference sensing signal VSA_CSOC is input to the buffer circuit OPBF, and the third sensing signal SA_SENSE may be a signal output from the buffer circuit OPBF after the third reference sensing signal VSA_SENSE is input to the buffer circuit OPBF.

The buffer circuit OPBF may be implemented as a single operational amplifier including a first input terminal, a second input terminal connected to an output terminal, and the output terminal, but is not limited thereto and may be implemented as various types of buffers.

Meanwhile, the reference signals VPB_SENSE, VSA_CSOC, and VSA_SENSE for generating the first sensing signal PB_SENSE, the second sensing signal SA_CSOC, and the third sensing signal SA_SENSE are required to be individually generated for each plane.

For example, the control logic 300 may support an overdrive function that supplies the first to third sensing signals PB_SENSE, SA_SENSE, and SA_CSOC generated using the reference signals VPB_SENSE, VSA_CSOC, and VSA_SENSE higher than the reference level to the page buffers PB1 to PBI in order to improve a sensing operation speed of the first bit line BL1 and an underdrive function that supplies the first to third sensing signals PB_SENSE, SA_SENSE, and SA_CSOC generated using the reference signals VPB_SENSE, VSA_CSOC, and VSA_SENSE lower than the reference level to the page buffers PB1 to PBI in order to prevent a peak current from flowing in the first bit line BL1.

At this time, as shown in FIG. 8, for a plane-interleave operation in which the plurality of planes P1 to P4 configuring the memory cell array 100 are simultaneously operated at a timing overlapping with each other in time, the overdrive or underdrive function may be required to be supported for each plane at an independent timing.

In FIG. 11, the overdrive and underdrive functions according to the plane-interleave operation for the first reference sensing signal VPB_SENSE among the reference signals VPB_SENSE, VSA_CSOC, and VSA_SENSE are shown, for example.

Referring to FIG. 11, as an example, a voltage level change of first reference sensing signals VPB_SENSE_P1, VPB_SENSE_P2, VPB_SENSE_P3, and VPB_SENSE_P4 of a case where memory cell array 100 includes the four planes P1 to P4 may be checked.

For example, for the plane-interleave operation, timings at which the first reference sensing signal VPB_SENSE_P1 for the first plane P1 reaches the reference level, the first reference sensing signal VPB_SENSE_P2 for the second plane P2 reaches the reference level, the first reference sensing signal VPB_SENSE_P3 for the third plane P3 reaches the reference level, and the first reference sensing signal VPB_SENSE_P4 for the fourth plane P4 reaches the reference level may be different from each other.

For example, for the plane-interleave operation, timings at which the first reference sensing signal VPB_SENSE_P1 for the first plane P1 reaches an overdrive level OVD higher than the reference level, the first reference sensing signal VPB_SENSE_P2 for the second plane P2 reaches the overdrive level OVD higher than the reference level, the first reference sensing signal VPB_SENSE_P3 for the third plane P3 reaches the overdrive level OVD higher than the reference level, and the first reference sensing signal VPB_SENSE_P4 for the fourth plane P4 reaches the overdrive level OVD higher than the reference level may be different from each other.

In addition, for the plane-interleave operation, timings at which the first reference sensing signal VPB_SENSE_P1 for the first plane P1 reaches an underdrive level UND lower than the reference level, the first reference sensing signal VPB_SENSE_P2 for the second plane P2 reaches the underdrive level UND lower than the reference level, the first reference sensing signal VPB_SENSE_P3 for the third plane P3 reaches the underdrive level UND lower than the reference level, and the first reference sensing signal VPB_SENSE_P4 for the fourth plane P4 reaches the underdrive level UND lower than the reference level may be different from each other.

Therefore, the first reference sensing signal VPB_SENSE may be required to be generated to have the overdrive level OVD and the underdrive level UND independently for each of the planes. In addition, similarly to the first reference sensing signal VPB_SENSE, the second reference sensing signal VSA_CSOC and the third reference sensing signal VSA_SENSE may be required to be generated to have the overdrive level OVD and the underdrive level UND independently for each of the planes.

Figure 12:
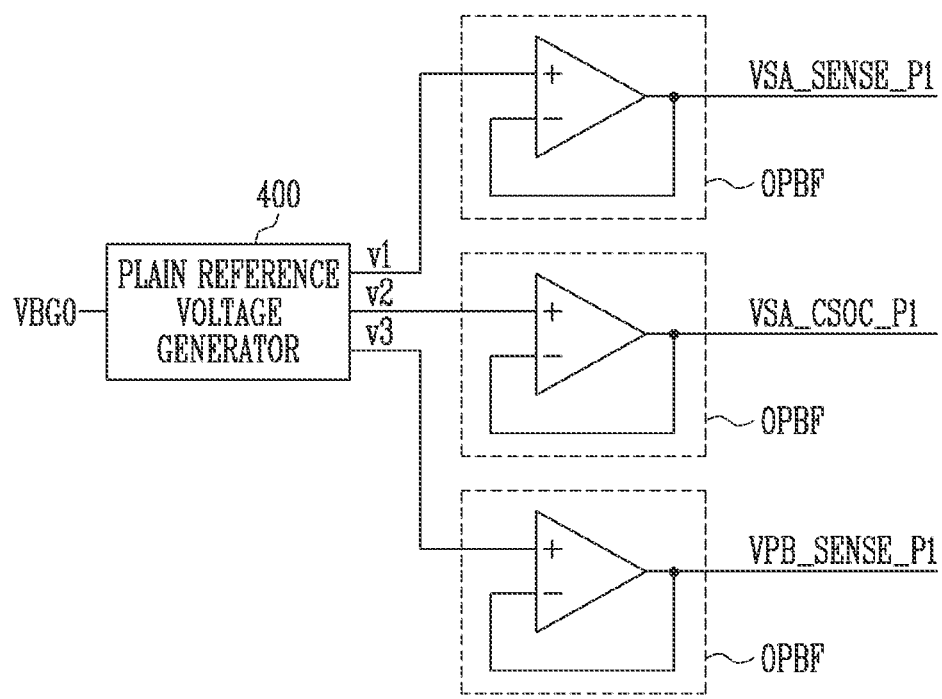
FIG. 12 is an example of a diagram illustrating a method for individually generating the reference signals for each of planes.

FIG. 12 is an example of a diagram illustrating a method for individually generating the reference signals for each of planes.

One of the methods for the reference signals VPB_SENSE, VSA_CSOC, and VSA_SENSE to independently have the overdrive level OVD and the underdrive level UND for each of the planes may be generating the reference signals VPB_SENSE, VSA_CSOC, and VSA_SENSE individually for each of the planes.

Referring to FIG. 12, the memory device 1100 may include a plane reference voltage generator 400 in order to generate the reference signals VPB_SENSE_P1, VSA_SENSE_P1, and VSA_CSOC_P1 for the first plane P1. In addition, although not shown in FIG. 12, the memory device 1100 may include an individual plane reference voltage generator 400 for each plane in order to independently generate the reference signals VPB_SENSE, VSA_CSOC, and VSA_SENSE for each of the planes.

The plane reference voltage generator 400 may generate an output voltage (not shown) by receiving a constant voltage VBG0 that is mitigated from a temperature change, and divide the generated output voltage into three voltage levels to generate a first output voltage v1, a second output voltage v2, and a third output voltage v3. The first output voltage v1 may be input to the buffer circuit OPBF to generate the third reference sensing signal VSA SENSE P1 for the first plane P1, the second output voltage v2 may also be input to the buffer circuit OPBF to generate a second reference sensing signal VSA CSOC P1 for the first plane P1, and the third output voltage v3 may be input to the buffer circuit OPBF to generate a first reference sensing signal VPB_SENSE_P1 for the first plane P1.

The plane reference voltage generator 400 may generate voltages corresponding to the overdrive level and the underdrive level for the first to third output voltages v1 to v3, respectively, to support the overdrive function and the underdrive function.

As shown in FIG. 12, when the plane reference voltage generator 400 is provided for each of the planes, there is an advantage that a voltage level required for the plane-interleave operation may be individually generated for each of the planes. However, since an independent plane reference voltage generator 400 is required to be provided for each of the planes, the circuit area of the memory device 1100 is greatly increased, and since characteristics of the plane reference voltage generators 400 for each of the planes are slightly different, a mismatch may occur between the reference signals VPB_SENSE, VSA_CSOC, and VSA_SENSE generated for each of the planes.

Figure 13:
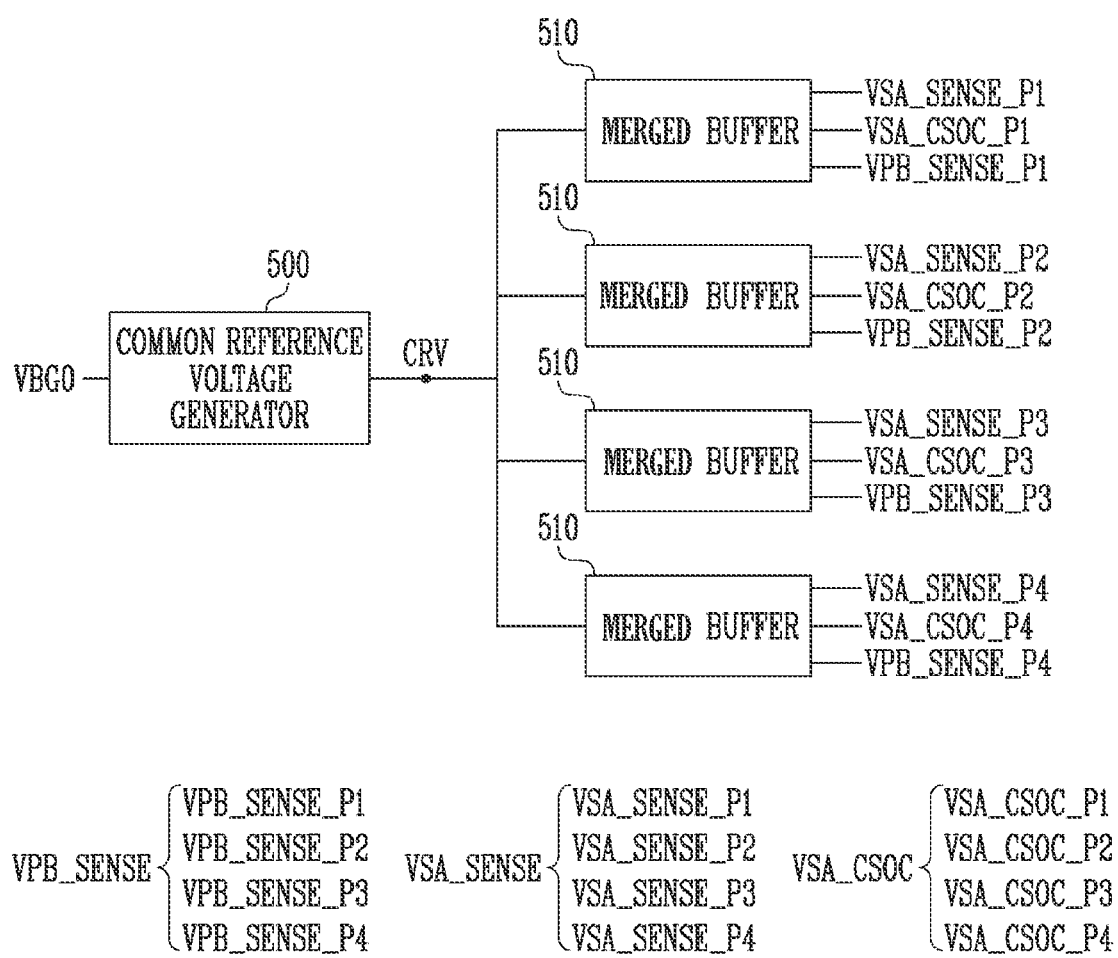
FIG. 13 is an example of a diagram illustrating another method for individually generating the reference signals for each of the planes.

FIG. 13 is an example of a diagram illustrating another method for individually generating the reference signals for each of the planes.

Referring to FIG. 13, the memory device 1100 may include the common reference voltage generator 500 that generates the common reference voltage CRV by receiving the constant voltage VBG0 that is mitigated from the temperature change, and the plurality of merged buffers 510 that generate the reference signals (for example, VPB_SENSE_P1, VSA_SENSE_P1, and VSA_CSOC_P1, which are the reference signals for the first plane P1) for one plane using the common reference voltage CRV. For example, one merged buffer may correspond to one plane. That is, since the merged buffer 510 generates the reference signals for one plane, the memory device 1100 including the plurality of planes may include the merged buffers 510 as many as the number corresponding to the number of planes.

Differently from the plane reference voltage generator 400 according to FIG. 12, since only one common reference voltage generator 500 is included in the memory device 1100, there is an advantage that the circuit area may be greatly reduced compared to a case of FIG. 12.

Meanwhile, even though one single common reference voltage generator 500 is used, the reference signals of the overdrive level and the underdrive level for the plane-interleave operation may be required to be generated. To this end, in FIG. 13, the merged buffer 510 may generate the reference signals VPB_SENSE, VSA_CSOC, and VSA_SENSE corresponding to the overdrive level and the underdrive level using the common reference voltage CRV.

Figure 14:
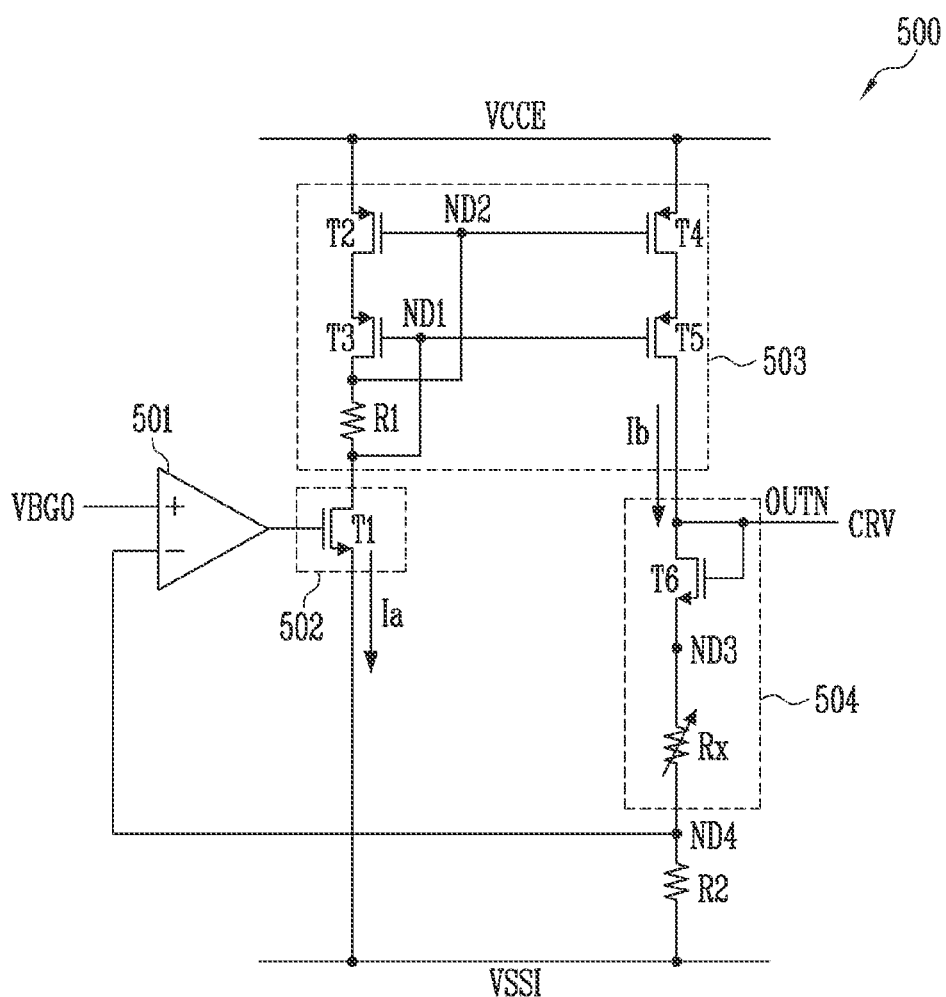
FIG. 14 is an example of a circuit diagram of a common reference voltage generator according to FIG. 13.
Figure 15:
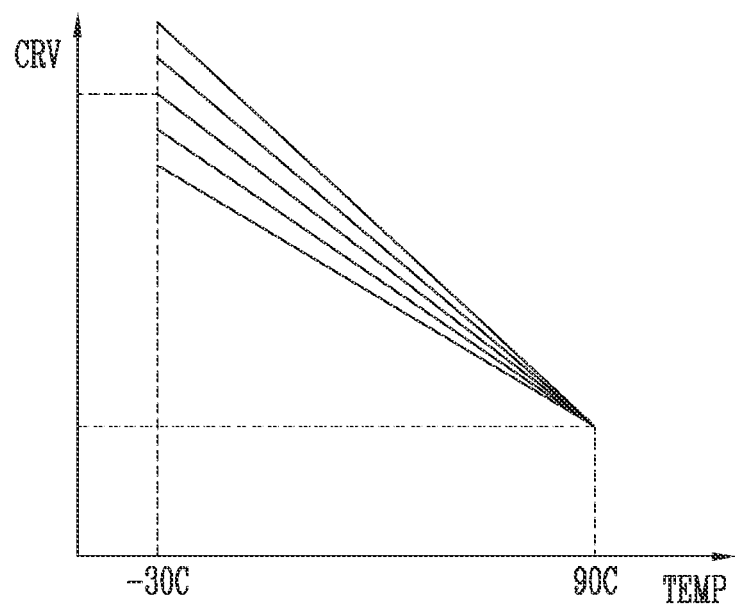
FIG. 15 is an example of a graph illustrating a point in which a common reference voltage is generated differently according to a temperature.

FIG. 14 is an example of a circuit diagram of the common reference voltage generator according to FIG. 13. FIG. 15 is an example of a graph illustrating that the common reference voltage is generated differently according to a temperature.

Referring to FIG. 14, the common reference voltage generator 500 may include an operational amplifier 501, a first initial current generator 502 that generates a first initial current Ia based on an output of the operational amplifier 501, an initial current mirror component 503 that generates a second initial current Ib corresponding to the first initial current Ia, and a temperature compensator 504 that outputs the common reference voltage CRV compensating for the temperature change of the bit line based on the second initial current Ib generated by the initial current mirror component 503.

The operational amplifier 501 may include a first input terminal to which the constant voltage VBG0 that is mitigated from the temperature change is applied, a second input terminal electrically connected to an output node OUTN of the common reference voltage generator 500 by feeding back the output node OUTN, and an output terminal amplifying and outputting a difference value between signals applied to the first input terminal and the second input terminal.

The first current generator 502 may include a first transistor T1 including a gate electrode connected to the output terminal of the operational amplifier 501 and connected between a first node ND1 and second power VSSI. The first transistor T1 may be turned on in response to an output of the operational amplifier 501 to conduct a first current Ia between the first node ND1 and the second power VSSI.

The initial current mirror component 503 may include a first resistor R1 connected between the first node ND1 and a second node ND2, a second transistor T2 connected between first power VCCE and a third transistor T3 and having a gate electrode connected to the second node ND2, the third transistor T3 connected between the second transistor T2 and the second node ND2 and having a gate electrode connected to the first node ND1, a fourth transistor T4 connected between the first power VCCE and a fifth transistor T5 and having a gate electrode connected to the second node ND2, and the fifth transistor T5 connected between the fourth transistor T4 and the output node OUTN and having a gate electrode connected to the first node ND1.

The temperature compensator 504 may include a sixth transistor T6 connected between the output node OUTN and a third node ND3 and having a gate electrode connected to the output node OUTN, and a variable resistor Rx connected between the third node ND3 and a fourth node ND4. Here, the variable resistor Rx may be a resistance determined by the control logic 300 so that a preset voltage (for example, a voltage between 0.2 and 0.65) is applied to the third node ND3. For example, the resistance value of the variable resistor Rx may be determined based on the first control signal CSIG1 supplied from the control logic 300.

The first transistor T1 and the sixth transistor T6 shown in FIG. 14 may be NMOS transistors, and the second to fifth transistors T2 to T5 may be PMOS transistors, but are not limited thereto. It should be construed to include applying a reverse of the PMOS transistor and the NMOS transistor, and substituting a connection relationship between the transistors correspondingly (reversely substituting the connection relationship between the transistors so that the current flow direction is reversed). In an embodiment, a second resistor R2 may be connected between the fourth node ND4 and the second power VSSI.

Meanwhile, the sixth transistor T6 may have a characteristic corresponding to that of the transistor (at least one of the first to third NMOS transistors N1 to N3) that receives one of the first to third sensing signals PB_SENSE, SA_CSOC, and SA_SENSE in the page buffer (for example, the first page buffer PB1) according to FIG. 9. For example, the sixth transistor T6 may have a threshold voltage characteristic corresponding to a threshold voltage change according to a temperature of the first NMOS transistor N1 receiving the first sensing signal PB_SENSE in FIG. 9. That is, since a threshold voltage of the sixth transistor T6 is changed to correspond to the threshold voltage change according to the temperature of the first NMOS transistor N1, a threshold voltage characteristic change according to the temperature may be reflected by the temperature compensator 504.

The threshold voltage change of at least one transistor (for example, the first NMOS transistor N1 receiving the first sensing signal PB_SENSE) connected to the bit line may cause a change in the voltage applied to the bit line. At this time, since the temperature compensator 504 generates the common reference voltage CRV at the output node OUTN in consideration of a characteristic change (for example, the threshold voltage characteristic) according to the temperature of at least one transistor connected to the bit line, the voltage of the bit line may always be maintained to be constant (to minimize a voltage change according to the temperature). In other words, the common reference voltage CRV may be differently generated according to the temperature to compensate for the voltage change according to the temperature of the bit line.

Referring to FIG. 15, a graph in which the common reference voltage CRV is generated differently as a temperature TEMP changes is shown. That is, as shown in FIG. 15, the common reference voltage CRV may be generated to have a higher voltage as the temperature decreases and a lower voltage as the temperature increases.

Figure 16:
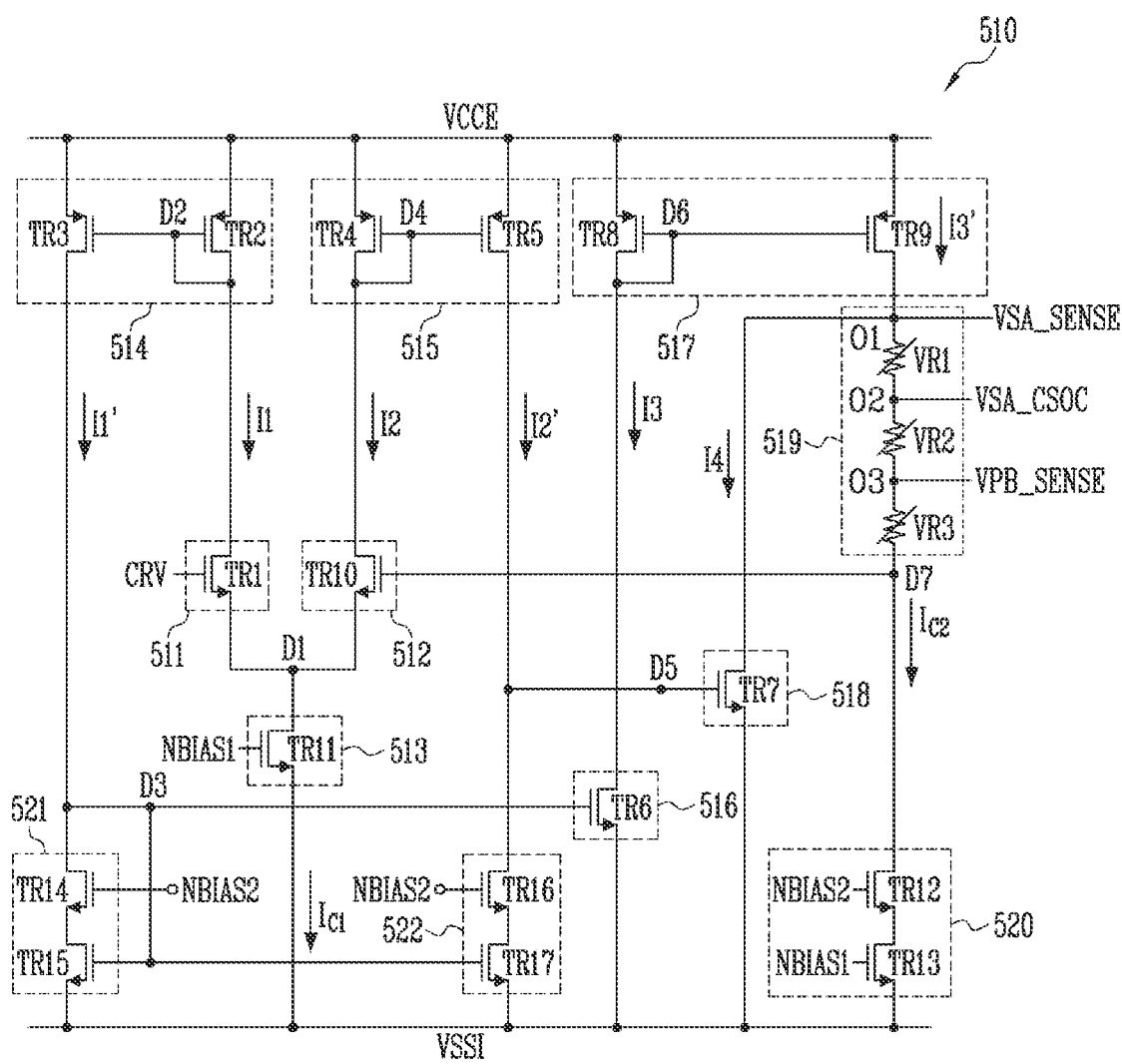
FIG. 16 is an example of a circuit diagram illustrating a merged buffer according to FIG. 13.

FIG. 16 is an example of a circuit diagram illustrating the merged buffer according to FIG. 13.

Referring to FIG. 16, the merged buffer 510 may include an input circuit 511 receiving the common reference voltage CRV, at least one current mirror component 514, 515, and 517 generating a current and a mirror current having a magnitude corresponding to each other, at least one current induction component 516 and 518 outputting a current in response to the mirror current, an output circuit 519 generating the reference signals VPB_SENSE, VSA_CSOC, and VSA_SENSE for one plane based on the current and the mirror current output from the current induction component 516 and 518, a feedback component 512 generating a current in response to a voltage fed back from the output circuit 519, and at least one constant current generator 513 and 520 generating a constant current of a constant magnitude.

In addition, the merged buffer 510 may further include at least one mirror current receiver 521 and 522 receiving the mirror current.

The input circuit 511 may be electrically connected to the first power VCCE through the first current mirror component 514 and may generate a first current I1 in response to the common reference voltage CRV.

The feedback component 512 may be electrically connected to the first power VCCE through the second current mirror component 515 and may generate a second current I2 in response to the voltage fed back from the output circuit 519.

The at least one constant current generator 513 and 520 may include a first constant current generator 513 connected between the first node D1, which is a common node for the input circuit 511 and the feedback component 512, and the second power VSSI and outputting a first constant current Ic1 of a constant magnitude, and a second constant current generator 520 connected between the output circuit 519 and the second power VSSI and outputting a second constant current Ic2 of a constant magnitude. The first constant current generator 513 and the second constant current generator 520 may be implemented as a current source generating the first constant current Ic1 and a current source generating the second constant current Ic2, respectively.

For example, the input circuit 511 may include a first transistor TR1 connected between the first node D1 and the second node D2 and having a gate electrode receiving the common reference voltage CRV.

The at least one current mirror component 514, 515, and 517 may include a first current mirror component 514 that generates a first mirror current I1' corresponding to the first current I1 and a second current mirror component 515 that generates a second mirror current I2' corresponding to the second current I2.

For example, the first current mirror component 514 may include a second transistor TR2 connected between the first power VCCE and the second node D2 and having a gate electrode connected to the second node D2, and a third transistor TR3 connected between the first power VCCE and the third node D3 and having a gate electrode connected to the second node D2.

For example, the second current mirror component 515 may include a fourth transistor TR4 connected between the first power VCCE and the fourth node D4 and having a gate electrode connected to the fourth node D4, and a fifth transistor TR5 connected between the first power VCCE and a fifth node D5 and having a gate electrode connected to the fourth node D4.

The at least one current induction component 516 and 518 may include a first current induction component 516 that output a third current I3 in response to the first mirror current I1' and a second current induction component 518 that outputs a fourth current I4 in response to the second mirror current I2'.

For example, the first current induction component 516 may include a sixth transistor TR6 connected between the sixth node D6 and the second power VSSI and having a gate electrode connected to the third node D3. The second current induction component 518 may include a seventh transistor TR7 connected between a first output node O1 and the second power VSSI and having a gate electrode connected to the fifth node D5.

The at least one current mirror component 514, 515, and 517 may further include a third current mirror component 517 that generates a third mirror current I3' corresponding to the third current I3. For example, the third current mirror component 517 may include an eighth transistor TR8 connected between the first power VCCE and a sixth node D6 and having a gate electrode connected to the sixth node D6, and a ninth transistor TR9 connected between the first power VCCE and the first output node O1 and having a gate electrode connected to the sixth node D6.

The output circuit 519 may be connected between the first output node O1, which is commonly connected to the third current mirror component 517 and the second current induction component 518, and a seventh node D7 of the second constant current generator 520, and may receive a differential current between the third mirror current I3' and the fourth current I4 through the first output node O1.

The output circuit 519 may output the third reference sensing signal VSA_SENSE through the first output node O1, distribute a voltage applied to the first output node O1, output the second reference sensing signal VSA_CSOC through a second output node O2, and output first reference sensing signal VPB_SENSE through a third output node O3. For example, the output circuit 519 may include a first variable resistor VR1 connected between the first output node O1 and the second output node O2, a second variable resistor VR2 connected between the second output node O2 and the third output node O3, and a third variable resistor VR3 connected between the third output node O3 and a seventh node D7 of the second constant current generator 520.

A resistance value of at least one of the first to third variable resistors VR1, VR2, and VR3 may be determined based on the drive control signal supplied from the control logic 300. Here, the resistance value is changed according to the drive control signal, and when the resistance value is changed, a voltage level of the reference signals may become the reference level, may be increased from the reference level to the overdrive level, or may be decreased from the reference level to the underdrive level. In more detail, for example, at least one of the first to third variable resistors VR1, VR2, VR3 may include a plurality of resistors and switching transistors connected to at least some of the plurality of resistors in parallel and receiving the drive control signal.

For example, the feedback component 512 may include a tenth transistor TR10 connected between the first node D1 and the fourth node D4 and having a gate electrode connected to the seventh node D7.

For example, the first constant current generator 513 may include an eleventh transistor TR11 connected between the first node D1 and the second power VSSI and having a gate electrode to which a first bias voltage NBIAS1 is applied. The second constant current generator 520 may include a twelfth transistor T12 connected between the seventh node D7 and a thirteenth transistor TR13 and having a gate electrode to which a second bias voltage NBIAS2 is applied, and the thirteenth transistor T13 connected between the twelfth transistor T12 and the second power VSSI and having a gate electrode to which the first bias voltage NBIAS1 is applied.

The at least one mirror current receiver 521 and 522 may include a first mirror current receiver 521 receiving the first mirror current I1' and a second mirror current receiver 522 receiving the second mirror current I2'.

The first mirror current receiver 521 may include a fourteenth transistor TR14 connected between the third node D3 and a fifteenth transistor TR15 and having a gate electrode to which the second bias voltage NBIAS2 is applied, and the fifteenth transistor TR15 connected between the fourteenth transistor TR14 and the second power VSSI and having a gate electrode connected to the third node D3.

The second mirror current receiver 522 may include a sixteenth transistor TR16 connected between the fifth node D5 and a seventeenth transistor TR17 and having a gate electrode to which the second bias voltage NBIAS2 is applied, and the seventeenth transistor TR17 connected between the sixteenth transistor TR16 and the second power VSSI and having a gate electrode connected to the third node D3.

In FIG. 16, the first transistor TR1 and the tenth to seventeenth transistors TR10 to 17 may be NMOS transistors, and the second to ninth transistors TR2 to TR9 may be PMOS transistors. In FIG. 16, the first power VCCE may supply a high level voltage higher than that of the second power VSSI, and the second power VSSI may supply a low level voltage or a ground voltage relatively lower than that of the first power VCCE.

Figure 17:
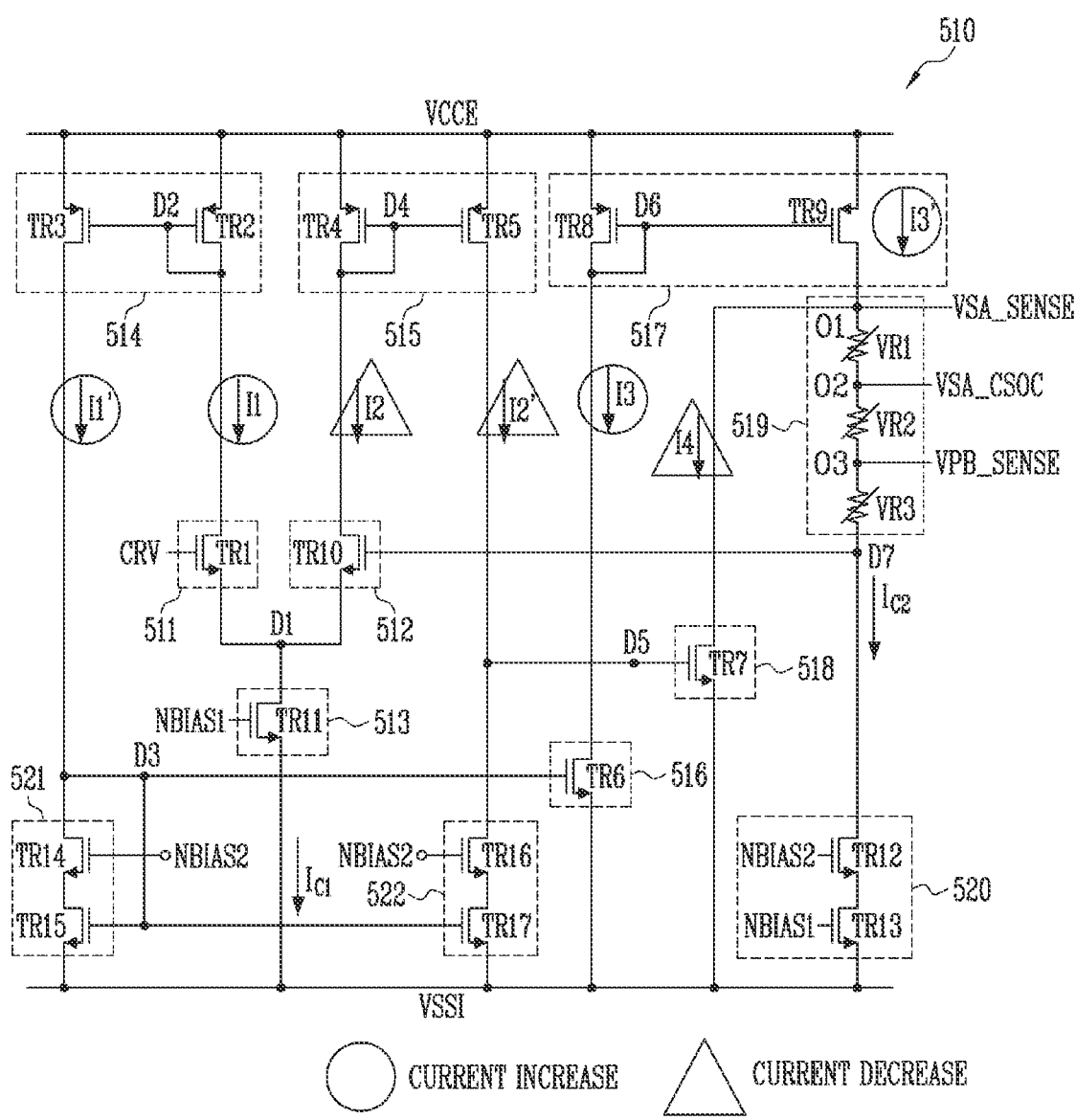
FIG. 17 is an example of a circuit diagram illustrating an operation of the merged buffer according to FIG. 16.

FIG. 17 is an example of a circuit diagram illustrating an operation of the merged buffer according to FIG. 16.

The merged buffer 510 according to FIG. 16 may generate and output the reference signals VPB_SENSE, VSA_CSOC, and VSA_SENSE through the output circuit 519. At this time, a case where the first reference sensing signal VPB_SENSE among the reference signals VPB_SENSE, VSA_CSOC, and VSA_SENSE suddenly decreases may be considered.

In this case, as a voltage applied to the gate electrode of the tenth transistor TR10 of the feedback component 512 decreases, a magnitude of the second current I2 may decrease. In addition, since a sum current of the first current I1 and the second current I2 by the first constant current generator 513 is the same as the first constant current Ic1 of the constant magnitude, a magnitude of the first current I1 may increase relative to the magnitude of the second current I2. A magnitude of the third current I3 generated through the first current induction component 516 may also increase by the first mirror current I1' corresponding to the increased first current I1. In addition, a magnitude of the third mirror current I3' may also increase to have a magnitude corresponding to that of the third current I3.

On the other hand, when the magnitude of the second current I2 decreases, a magnitude of the second mirror current I2' also decreases, and thus a magnitude of the fourth current I4 generated through the second current induction component 518 may also decrease. Since the magnitude of the third mirror current I3' increases and the magnitude of the fourth current I4 decreases, a current (a differential current between the third mirror current I3' and the fourth current I4) input through the output circuit 519 may increase, and a magnitude of the first reference sensing signal VPB_SENSE may increase. In the same manner, when the magnitude of the first reference sensing signal VPB_SENSE suddenly increases, the magnitude of the first reference sensing signal VPB_SENSE may decrease as the current fluctuates in a direction opposite to that of the increase and decrease of the current described above (or shown in FIG. 17).

In the same manner as the increase and decrease of the first reference sensing signal VPB_SENSE, the merged buffer 510 may operate in a direction that offsets increase and decrease of the second reference sensing signal VSA CSOC and the third reference sensing signal VSA SENSE.

As described above, since the merged buffer 510 quickly offsets the increase and decrease of the reference signals VPB_SENSE, VSA_CSOC, and VSA_SENSE, the merged buffer 510 may reduce a settling time and stably output the reference signals VPB_SENSE, VSA_CSOC, and VSA_SENSE.

In addition, the merged buffer 510 shown in FIG. 16 is not necessarily used only to generate the reference signals for the memory device 1100, but may be used as an independent regulator that stabilizes an output signal corresponding to the above-described reference signals VPB_SENSE, VSA_CSOC, and VSA_SENSE based on the above-described stabilization operation.

Figure 18:
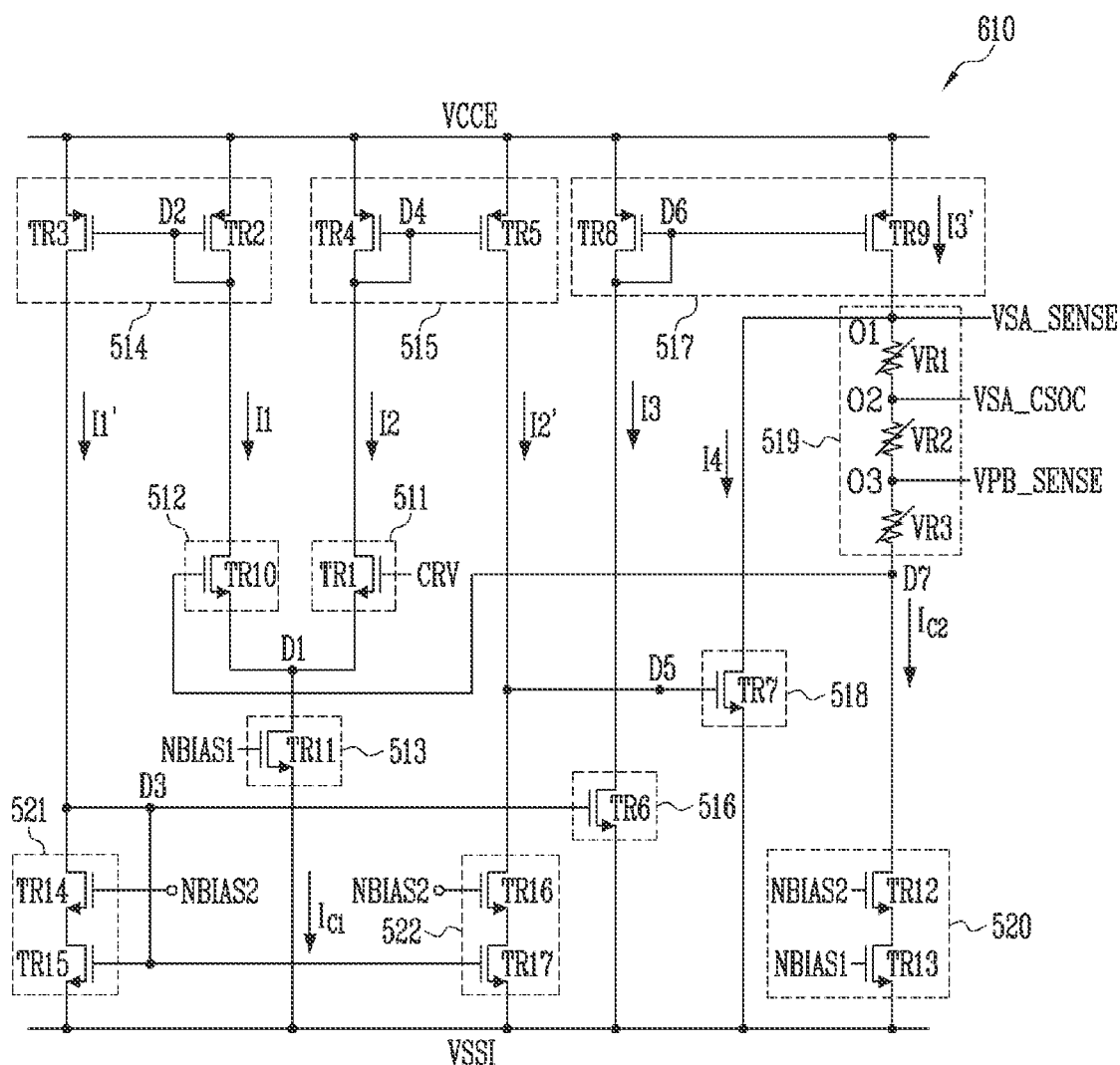
FIG. 18 is an example of a circuit diagram illustrating another embodiment of the merged buffer according to FIG. 16.
Figure 19:
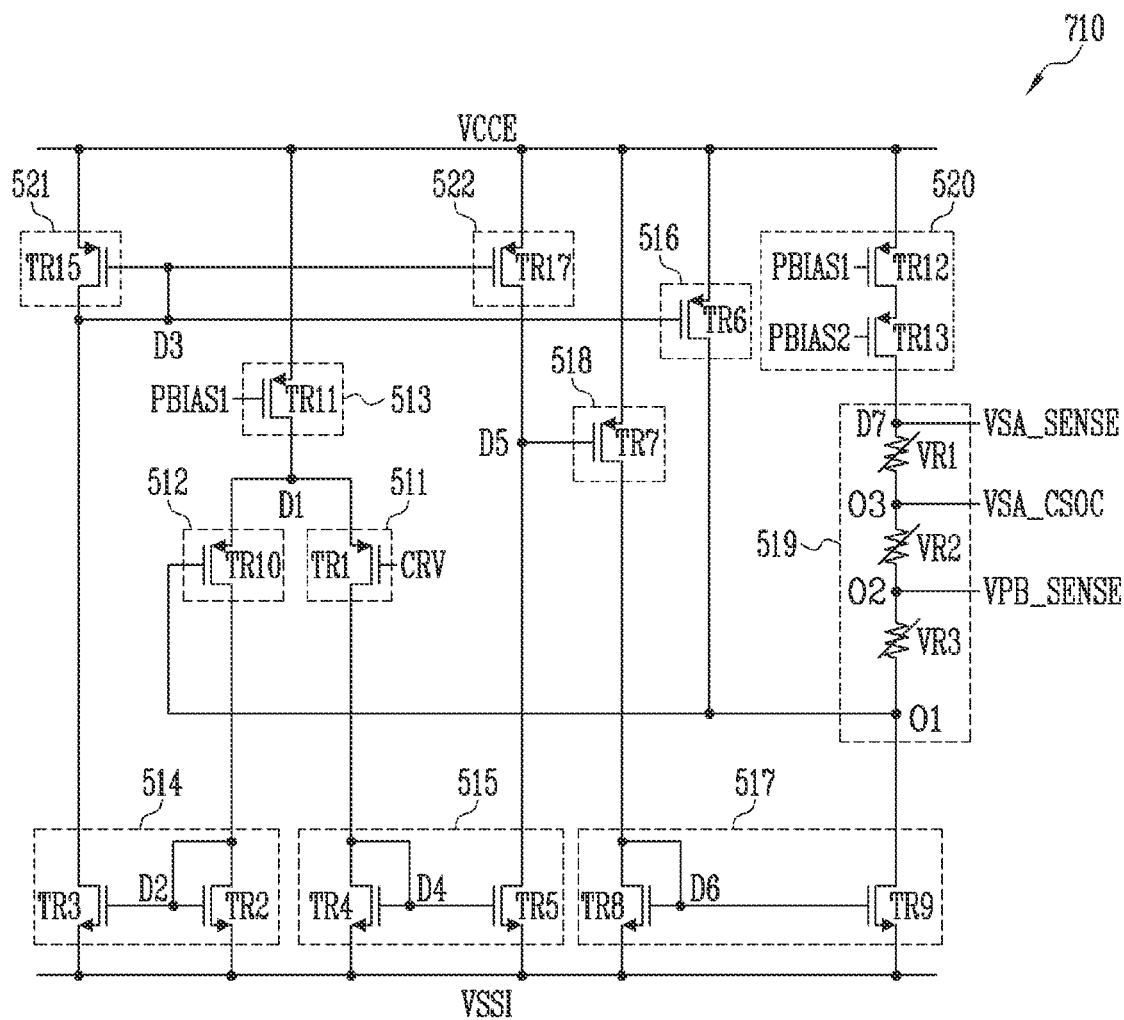
FIG. 19 is an example of a circuit diagram illustrating still another embodiment of the merged buffer according to FIG. 16.

FIG. 18 is an example of a circuit diagram illustrating another embodiment of the merged buffer according to FIG. 16. FIG. 19 is an example of a circuit diagram illustrating still another embodiment of the merged buffer according to FIG. 16.

Referring to FIG. 18, in the merged buffer 610 according to another embodiment, positions of the input circuit 511 and the feedback component 512 according to the merged buffer 510 according to FIG. 16 may be replaced.

Referring to FIG. 19, in the merged buffer 710 according to still another embodiment, the NMOS transistors included in the merged buffer 510 according to FIG. 16 may be substituted with PMOS transistors, and the PMOS transistors included in the merged buffer 510 according to FIG. 16 may be substituted with NMOS transistors, and a wiring order of each of components may be substituted in a reverse order. The transistors TR1 to TR17 shown in FIG. 19 are the same as the transistors TR1 to TR17 in FIG. 16, except that a transistor type is reversely substituted, and thus the transistors TR1 to TR17 shown with the same reference numerals.

Meanwhile, when the transistor type is substituted as shown in FIG. 19, the first bias voltage NBIAS1 and the second bias voltage NBIAS2 of FIG. 16 may be respectively substituted with a first PMOS voltage PBIAS1 and a second PMOS voltage PBIAS2, and a connection relationship between the first power VCCE and the second power VSSI may be substituted with each other.

In addition, a connection relationship between the sixth transistor TR6 and the seventh transistor TR7 in the merged buffer 510 of FIG. 16 may be substituted. For example, as shown in FIG. 19, the sixth transistor TR6 may be connected between the first output node O1 and the second power VSSI, and the seventh transistor TR7 may be connected to the sixth node D6 and the second power VSSI.

In addition, as shown in FIG. 19, the merged buffer 510 according to FIG. 16 may be changed so that one of the reference signals VPB_SENSE, VSA_CSOC, and VSA_SENSE is output through the seventh node D7 instead of the first output node O1.

In addition, as shown in FIG. 19, in the merged buffer 510 according to FIG. 16, the fourteenth transistor TR14 and the sixteenth transistor TR16 may be omitted.

Figure 20:
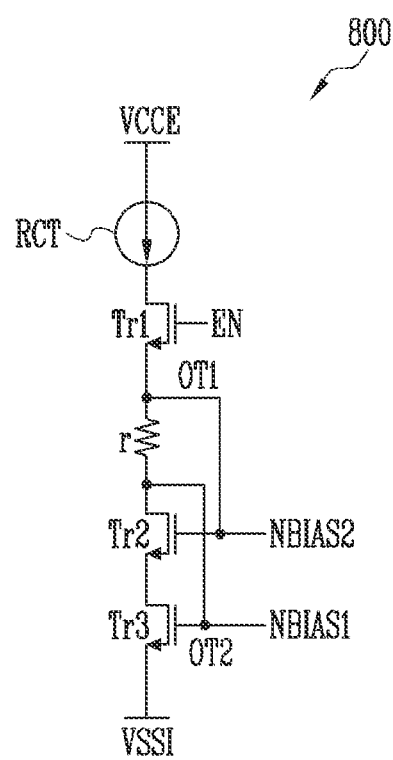
FIG. 20 is an example of a circuit diagram for generating bias voltages according to FIG. 16.

FIG. 20 is an example of a circuit diagram for generating the bias voltages according to FIG. 16.

The memory device 1100 according to an embodiment may include a bias voltage generator 800 that generates the bias voltages NBIAS1 and NBIAS2 according to FIG. 16.

For example, the bias voltage generator 800 may include a current source RCT that generates a constant current without being affected by a change in a temperature or a threshold voltage, a first transistor Tr1 having a gate electrode receiving an enable signal EN and connected between the current source RCT and a first bias output terminal OT1, a resistor r connected between the first bias output terminal OT1 and a second bias output terminal OT2, a second transistor Tr2 connected between the second bias output terminal OT2 and a third transistor Tr3 and having a gate electrode connected to the first bias output terminal OT1, and a third transistor Tr3 connected between the second transistor Tr2 and the second power VSSI and having a gate electrode connected to the second bias output terminal OT2.

Here, the resistor r may convert the current generated by the current source RCT into a voltage. The second bias voltage NBIAS2 may be output through the first bias output terminal OT1, and the first bias voltage NBIAS1 may be output through the second bias output terminal OT2.

The first transistor Tr1 may be turned on in response to the enable signal EN to transfer the current generated by the current source RCT to the resistor r.

The above-described enable signal EN may be included in the page buffer control signal PBSIGNALS supplied from the control logic 300.

Therefore, since the bias voltage generator 800 generates the constant bias voltages NBIAS1 and NBIAS2 without being affected by a temperature and the like and provides the constant bias voltages NBIAS1 and NBIAS2 to the merged buffer 510, the merged buffer 510 may generate the constant currents Ic1 and Ic2 that are not affected by the temperature and the like based on the bias voltages.

Figure 21:
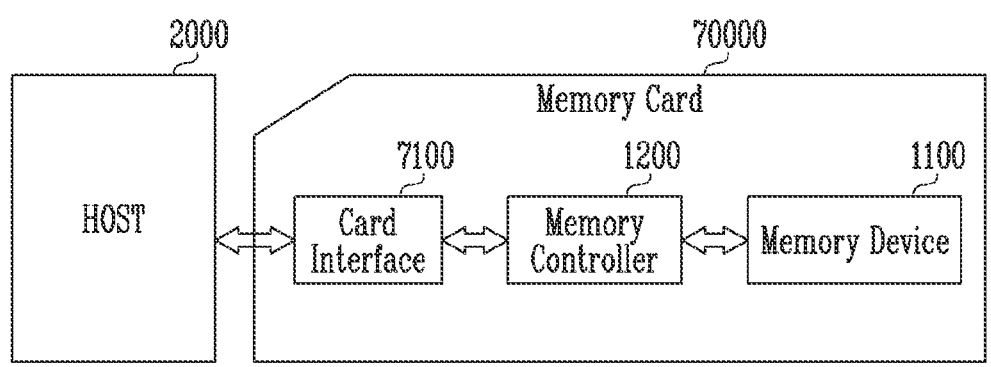
FIG. 21 is a diagram illustrating a memory card to which the memory system according to FIG. 1 is applied.

FIG. 21 is a diagram illustrating a memory card to which the memory systems according to FIG. 1 is applied.

Referring to FIG. 21, a memory system may include the host 2000 and the memory card 70000.

The memory card 70000 may be implemented as a smart card. The memory card 70000 may include the memory device 1100, the memory controller 1200, and a card interface 7100.

The memory controller 1200 may control data exchange between the memory device 1100 and the card interface 7100. According to an embodiment, the card interface 7100 may be a secure digital (SD) card interface or a multimedia card (MMC) interface, but is not limited thereto.

The card interface 7100 may interface data exchange between the host 2000 and the memory controller 1200 according to a protocol of the host 2000. According to an embodiment, the card interface 7100 may support a universal serial bus (USB) protocol, and an interchip (IC)-USB protocol. Here, the card interface 7100 may refer to hardware capable of supporting a protocol that is used by the host 2000, software installed in the hardware, or a signal transmission method.

Figure 22:
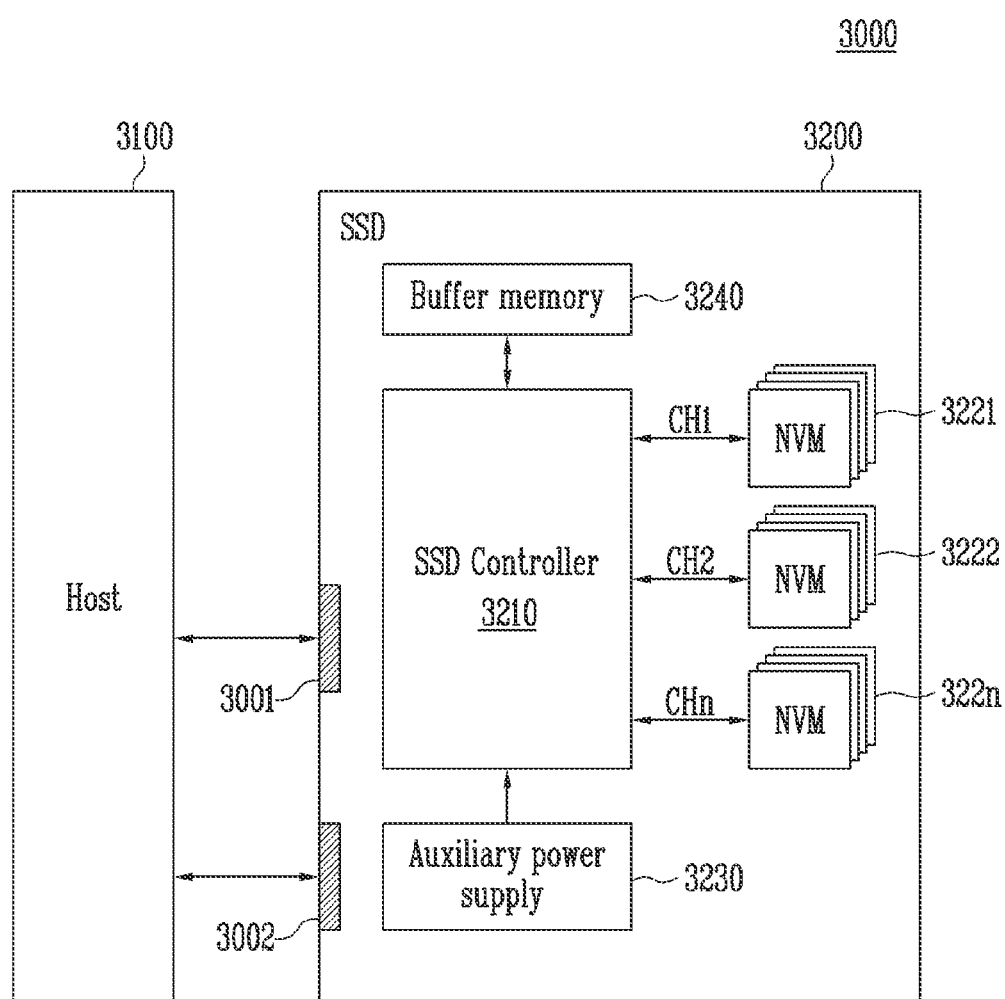
FIG. 22 is a block diagram illustrating a solid state drive (SSD) system to which the memory system according to FIG. 1 is applied.

FIG. 22 is a block diagram illustrating a solid state drive (SSD) system to which the memory systems according to FIG. 1 is applied.

Referring to FIG. 22, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

In an embodiment, the SSD 3200 may be a component corresponding to the memory device 1100, and may further include at least one of the buffer circuit OPBF, the plane reference voltage generator 400, the common reference voltage generator 500, the merged buffer 510, and the bias voltage generator 800 described with reference to FIGS. 10 to 20.

The SSD controller 3210 may control the plurality of flash memories 3221 to 322n in response to the signal SIG received from the host 3100. For example, the signal SIG may be signals based on an interface between the host 3100 and the SSD 3200. For example, the signal SIG may be a signal defined by at least one of interfaces such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. For example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store meta data (for example, a mapping table) of the flash memories 3221 to 322n. The buffer memory 3240 may include a volatile memory such as a DRAM, an SDRAM, a DDR SDRAM, an LPDDR SDRAM, and a GRAM, or a non-volatile memory such as an FRAM, a ReRAM, an STT-MRAM, and a PRAM.

What is claimed is:

1. A memory device comprising:
a memory cell array configured to include a plurality of planes having a plurality of memory cells;
a plurality of page buffers connected to the plurality of planes, respectively, through a plurality of bit lines and configured to perform a sensing operation on each of the plurality of planes independently;
a common reference voltage generator configured to generate a common reference voltage;
a plurality of merged buffers configured to generate a plurality of reference signals using the common reference voltage; and
control logic configured to control an operation of the plurality of page buffers using a plurality of page buffer control signals generated based on the plurality of reference signals,
wherein each of the plurality of merged buffers generates a reference signal corresponding to each of the plurality of planes.

2. The memory device of claim 1,
wherein the reference signal corresponds to one of an overdrive level higher than a preset reference level and an underdrive level lower than the preset reference level.

3. The memory device of claim 1,
wherein the plurality of page buffer control signals include a first sensing signal, a second sensing signal, and a third sensing signal for controlling the sensing operation, and
wherein the reference signal includes at least one of a first reference sensing signal for generating the first sensing signal, a second reference sensing signal for generating the second sensing signal, and a third reference sensing signal for generating the third sensing signal.

4. The memory device of claim 3, wherein each of the plurality of page buffers comprises:
a bit line connection component electrically connecting the plurality of bit lines and a common sensing node in response to the first sensing signal;
a precharge-sensing component including a sensing amplifier node, the precharge-sensing component electrically connecting the common sensing node and the sensing amplifier node in response to the second sensing signal and electrically connecting the common sensing node and a sensing node in response to the third sensing signal; and
a sensing data output circuit outputting data corresponding to a potential level of the sensing node.

5. The memory device of claim 4,
wherein the bit line connection component includes a first NMOS transistor connected between each of the plurality of bit lines and the common sensing node and having a gate electrode receiving the first sensing signal, wherein the precharge-sensing component comprises:
a second NMOS transistor connected between the common sensing node and the sensing amplifier node and having a gate electrode receiving the second sensing signal;
a third NMOS transistor connected between the common sensing node and the sensing node and having a gate electrode receiving the third sensing signal;
a fourth NMOS transistor connected between the sensing amplifier node and the sensing node and having a gate electrode receiving a precharge signal; and
a first PMOS transistor connected between a supply power and the sensing amplifier node and having a gate electrode connected to a latch node.

6. The memory device of claim 1, wherein the common reference voltage generator comprises:
an operational amplifier;
a first initial current generator configured to generate a first initial current based on an output of the operational amplifier;
an initial current mirror component configured to generate a second initial current corresponding to the first initial current; and
a temperature compensator configured to output the common reference voltage compensating for a temperature change of each of the plurality of bit lines based on the second initial current.

7. The memory device of claim 6, wherein the operational amplifier comprises:
a first input terminal receiving a constant voltage mitigated from a temperature change;
a second input terminal electrically connected to an output node of the common reference voltage generator to receive feedback of a voltage of the output node; and
an output terminal amplifying and outputting a differential value between signals applied to the first input terminal and the second input terminal.

8. The memory device of claim 6, wherein the temperature compensator includes a transistor having a threshold voltage characteristic corresponding to a threshold voltage characteristic of a transistor receiving at least one of the plurality of page buffer control signals from the plurality of page buffers.

9. The memory device of claim 3, wherein each of the plurality of merged buffers comprises:
an input circuit configured to receive the common reference voltage;
at least one constant current generator configured to generate a constant current having a constant magnitude;
at least one current mirror component configured to generate a current and a mirror current having a magnitude corresponding to each other;
at least one current induction component configured to output a current in response to the mirror current;
an output circuit configured to generate the reference signal based on the current output from the at least one current induction component and the mirror current; and
a feedback component configured to generate a current in response to a voltage fed back from the output circuit.

10. The memory device of claim 9,
wherein the input circuit is electrically connected to first power through the at least one current mirror component and generates a first current in response to the common reference voltage, and
wherein the feedback component is electrically connected to the first power through the at least one current mirror component and generates a second current in response to the fed back voltage.

11. The memory device of claim 10, wherein the at least one constant current generator comprises:
a first constant current generator connected between a first node which is a common node for the input circuit and the feedback component and second power to output a first constant current of a constant magnitude; and
a second constant current generator connected between the output circuit and the second power to output a second constant current having a constant magnitude.

12. The memory device of claim 11, wherein the at least one current mirror component comprises:
a first current mirror component configured to generate a first mirror current corresponding to the first current; and
a second current mirror component configured to generate a second mirror current corresponding to the second current.

13. The memory device of claim 12, wherein the at least one current induction component comprises:
a first current induction component configured to output a third current in response to the first mirror current; and
a second current induction component configured to output a fourth current in response to the second mirror current, and
the at least one current mirror component further comprises a third current mirror component generating a third mirror current corresponding to the third current.

14. The memory device of claim 13,
wherein the output circuit is connected between a first output node, which is commonly connected to the third current mirror component and the second current induction component, and the second constant current generator, and receives a differential current between the third mirror current and the fourth current through the first output node.

* * * * *